(12) United States Patent
Kano

(10) Patent No.: US 6,417,520 B1
(45) Date of Patent: Jul. 9, 2002

(54) SEMICONDUCTOR DEVICE WITH QUANTUM-WAVE INTERFERENCE LAYERS

(75) Inventor: Hiroyuki Kano, Aichi-ken (JP)

(73) Assignee: Canare Electric Co., Ltd., Aichi-gun (JP)

(*) Notice: Subject to any disclaimer, the term of this patent is extended or adjusted under 35 U.S.C. 154(b) by 76 days.

(21) Appl. No.: 09/645,931

(22) Filed: Aug. 25, 2000

(30) Foreign Application Priority Data

Aug. 27, 1999 (JP) ............................................. 11-241637

(51) Int. Cl.[7] .............................................. H01L 33/00
(52) U.S. Cl. .............................. 257/17; 257/13; 257/26; 257/97; 257/183
(58) Field of Search ................................. 257/9, 12, 13, 257/14, 15, 17–23, 26, 27, 29, 94, 96, 97, 183, 201

(56) References Cited

U.S. PATENT DOCUMENTS 5,737,350 A * 4/1998 Motoda et al. ................ 372/45
6,097,041 A * 8/2000 Lin et al. ...................... 257/98

OTHER PUBLICATIONS

Guthrie et al., "Measurement of zero–bias electron transmittance as a function of energy for half–and quarter–electron–wavelength semiconductor–interference filters," Jan. 19, 1998, Appl. Phys. Lett. 72(3), pp. 374–376.*

U.S. application No. 09/057,549, filed Apr. 9, 1998, allowed.

U.S. application No. 09/064,222, filed Apr. 22, 1998, allowed.

U.S. application No. 09/059,374, filed Apr. 14, 1998, allowed.

U.S. application No. 09/245,299, filed Feb. 5, 1999, pending.

(List continued on next page.)

Primary Examiner—Eddie Lee
Assistant Examiner—Bradley William Baumeister
(74) Attorney, Agent, or Firm—Oblon, Spivak, McClelland, Maier & Neustadt, P.C.

(57) ABSTRACT

A light-emitting diode comprising a quantum-wave reflection layer for electrons, a quantum-wave transmission layer for electrons, and an emission layer formed between the quantum-wave reflection layer and the quantum-wave transmission layer is used as a photocoupler. Compared with a commercial product having a response velocity of 20 MHz, a response velocity of the light-emitting diode of the present invention is improved to be 100 MHz to 200 MHz. The quantum-wave reflection layer for electrons and the quantum-wave transmission layer for electrons are formed to have thicknesses of one fourth and a half of quantum wave of electrons, respectively.

37 Claims, 10 Drawing Sheets

OTHER PUBLICATIONS

U.S. application No. 09/296,743, filed Apr. 23, 1999, pending.
U.S. application No. 09/300,389, filed Apr. 27, 1999, pending.
U.S. application No. 09/320,510, filed May 26, 1999, pending.
U.S. application No. 09/421,221, filed Oct. 20, 1999, pending.
U.S. application No. 09/422,078, filed Oct. 21, 1999, pending.
U.S. application No. 09/425,737, filed Oct. 22, 1999, pending.
U.S. application No. 09/425,735, filed Oct. 22, 1999, pending.
U.S. application No. 09/425,685, filed Oct. 22, 1999, pending.
U.S. application No. 09/461,331, filed Dec. 15, 1999, pending.
U.S. application No. 09/461,756, filed Dec. 16, 1999, pending.
U.S. application No. 09/636,081, filed Aug. 11, 2000, pending.
U.S. application No. 09/645,931, filed Aug. 25, 2000, pending.
U.S. application No. 09/648,367, filed Aug. 25, 2000, pending.
U.S. application No. 09/645,932, filed Aug. 25, 2000, pending.
U.S. application No. 09/699,855, filed Sep. 27, 2000, pending.
U.S. application No. 09/645,931, filed Aug. 25, 2000, pending.
U.S. application No. 09/688,201, filed Oct. 16, 2000, pending.
U.S. application No. 09/695,312, filed Oct. 25, 2000, pending.
U.S. application No. 09/645,931, filed Aug. 25, 2000, pending.
U.S. application No. 09/915,384, filed Jul. 27, 2001, pending.

* cited by examiner

SEMICONDUCTOR DEVICE WITH QUANTUM-WAVE INTERFERENCE LAYERS

BACKGROUND OF THE INVENTION

1. Field of the Invention

The present invention relates to a semiconductor device with a quantum-wave interference layer which reflects carriers, i.e., electrons or holes, effectively and a quantum-wave interference layer which transmits carriers, i.e., electrons or holes, effectively. Especially, the present invention relates to a light-emitting device such as a laser or a light-emitting diode with a structure which confines carriers in an active layer so as to improve its luminous efficiency.

2. Description of the Related Art

A semiconductor device has been known to have a double hereto junction structure whose active layer is formed between n-type and p-type cladding layers. The cladding layers function as potential barriers for effectively confining carriers, or electrons and holes, within the active layer.

However, a problem persists in luminous efficiency. Carriers overflow the potential barriers of the cladding layers, which lowers luminous efficiency. Therefore, further improvement has been required, as presently appreciated by the present inventors.

As a countermeasure, forming cladding layers having a multiple quantum well structure of a first and a second layer as a unit in a laser diode in order to reflect carriers has been suggested by Takagi et al. (Japanese Journal of Applied Physics. Vol. 29, No.11, November 1990, pp.L1977–L1980). This reference, however, does not teach or suggest values of kinetic energy of carriers to be considered.

SUMMARY OF THE INVENTION

The inventor of the present invention conducted a series of experiments and found that, although it can be understood that Takagi et al. used a band gap energy alternative to a kinetic energy, the suggested thickness of the first and the second layers by Takagi et al. were too small to confine electrons, and that preferable thicknesses of the first and second layers are 4 to 6 times larger than those suggested by Takagi et al. So a problem still persisted in inadequacy of reflecting carriers.

Further, the present inventor thought that multiple quantum-wave reflection of carriers might occur by a multiple layer structure with different band width, like multiple light reflection by a dielectric multi-film structure. And the inventor thought that it would be possible to confine carriers by the reflection of the quantum-wave interference layer and filed an application with respect to this (Japanese Patent Application laid-open No. H10-303406).

Then the inventor of the present invention concerned a characteristic of electrons as a wave and considered that the quantum-wave interference layer functions as a transmission layer of carriers, by analogy with the multiple reflection of the light. That is, when each thickness of layers in the. multiple layer structure is about an order of the wavelength of a quantum-wave of carriers, an interference effect of quantum-wave is considered to occur with respect to a conduction of carriers in the multiple layer structure. The interference effect caused a conduction as a wave. Accordingly, the inventor of the present invention considered that not a conduction of particle in a classical theory but a resonance of waves, an interference, or other phenomenon is occurred by an interference effect of electrons. This wave behavioral characteristic of electrons improves a mobility and a propagation velocity.

It is, therefore, a first object of the present invention is to provide a semiconductor device with a new structure, having both of a quantum-wave interference layer with a large reflectivity to carriers, which functions as a reflection layer, and a quantum-wave interference layer with a high transmittivity and a high mobility to carriers, which functions as a transmission layer.

In light of these objects a first characteristic group of this invention is described as follows. A first aspect of the present invention is a semiconductor device constituted by a first quantum-wave interference layer having plural periods of a pair of a first layer and a second layer, the second layer having a wider band gap than the first layer, and a second quantum-wave interference layer having plural periods of a pair of a third layer and a fourth layer, the fourth layer having a wider band gap than the third layer. Each thickness of the first and the second layers in the first quantum-wave interference layer is determined by multiplying by an odd number one fourth of a quantum-wave wavelength of carriers in each of the first and the second layers, and each thickness of the third and the fourth layers in the second quantum-wave interference layer is determined by multiplying by an even number one fourth of a quantum-wave wavelength of carriers in each of the third and the fourth layers.

A second aspect of the present invention is to form each thickness of the first and the second layers in the first quantum-wave interference layer by multiplying by an odd number one fourth of quantum-wave wavelength of carriers in each of the first and the second layers existing at the level near the lowest energy level of the second layer and to form each thickness of the third and the fourth layers in the second quantum-wave interference layer by multiplying an even number one fourth of quantum-wave wavelength of carriers in each of the third and the fourth layers existing at the level near the lowest energy level of the fourth layer.

A third aspect of the present invention is to form a $\delta_R$ layer, which varies an energy band sharply, at an interface between the first and the second layers. A thickness of the $\delta_R$ layer is substantially thinner than that of the first and the second layers.

A fourth aspect of the present invention is to form a $\delta_T$ layer, which varies an energy band sharply, at an interface between the third and the fourth layers. A thickness of the $\delta_T$ layer is substantially thinner than that of the third and the fourth layers.

A fifth aspect of the present invention is to define each thickness of the first and the second layers as follows:

$$D_{RW}=n_{RW}\lambda_{RW}/4=n_{RW}h/4[2m_{RW}(E_R+V_R)]^{1/2} \quad (1\text{-}1)$$

and $$D_{RB}=n_{RB}\lambda_{RB}/4=n_{RB}h/4(2m_{RB}E_R)^{1/2} \quad (1\text{-}2)$$

A sixth aspect of the present invention is to define each thickness of the third and the fourth layers as follows:

$$D_{TW}=n_{TW}\lambda_{TW}/4=n_{TW}h/4[2m_{TW}(E_T+V_T)]^{1/2} \quad (1\text{-}3)$$

and $$D_{TB}=n_{TB}\lambda_{TB}/4=n_{TB}h/4(2m_{TB}E_T)^{1/2} \quad (1\text{-}4)$$

In Eqs. 1-1 to 1-4, h, $m_{RW}$, $m_{RB}$, $m_{TW}$, $m_{TB}$, $E_R$, $E_T$, $V_R$, $V_T$, $n_{RW}$, $n_{RB}$ and $n_{TW}$, $n_{TB}$ represent Plank's constant, the effective mass of carriers in the first layer, the effective mass of carriers in the second layer, the effective mass of carriers in the third layer, the effective mass of carriers in the fourth layer, the kinetic energy of the carriers at the level near the lowest energy level of the second layer, the kinetic energy of the carriers at the level near the lowest energy level of the fourth layer, the potential energy of the second layer relative to the first layer, the potential energy of the fourth layer relative to the third layer, odd numbers and even numbers, respectively. Carriers injected into the second layer and the fourth layer are preferably existing around the lowest energy of the second layer and the. fourth layer, respectively.

A seventh aspect of the present invention is the first quantum-wave interference layer having a plurality of partial quantum-wave interference layers $I_{Rk}$ with arbitrary periods $T_{Rk}$ including a first layer having a thickness of $D_{RWk}$ and a second layer having a thickness of $D_{RBk}$ and arranged in series. The thicknesses of the:first and the second layers satisfy the formulas:

$$D_{RWk} = n_{RWk} \lambda_{RWk}/4 = n_{RWk} h/4[2m_{RWk}(E_{Rk}+V_R)]^{1/2} \quad (2\text{-}1)$$

and $$D_{RBk} = n_{RBk} \lambda_{RBk}/4 = n_{RBk} h/4(2m_{RBk}E_{Rk})^{1/2} \quad (2\text{-}2)$$

In Eqs. 2-1 and 2-2, $E_{Rk}$, $m_{RWk}$, $m_{RBk}$, and $n_{RWk}$, $n_{RBk}$ represent plural kinetic energy levels of carriers flowing into the second layer, effective mass of carriers with kinetic energy $E_{Rk}+V_R$ in the first layer, effective mass of carriers with kinetic energy $E_{Rk}$ in the second layer, and arbitrary odd numbers, respectively.

The plurality of the partial quantum-wave interference layers $I_{Rk}$ are arranged in series from $I_{R1}$ to $I_{Rj}$, where j is a maximum number of k required to from a first quantum-wave interference layer as a whole.

An eighth aspect of the present invention is the second quantum-wave interference layer having a plurality of partial quantum-wave interference layers $I_{Tk}$ with arbitrary periods $T_{Tk}$ including a third layer having a thickness of $D_{TWk}$ and a fourth layer having a thickness of $D_{TBk}$ and arranged in series. The thicknesses of the third and the fourth layers satisfy the formulas:

$$D_{TWk} = n_{TWk} \lambda_{TWk}/4 = n_{TWk} h/4[2m_{TWk}(E_{Tk}+V_T)]^{1/2} \quad (3\text{-}1)$$

and $$D_{TBk} = n_{TBk} \lambda_{TBk}/4 = n_{TBk} h/4(2m_{TBk}E_{Tk})^{1/2} \quad (3\text{-}2)$$

In Eqs. 3-1 and 3-2, $E_{Tk}$, $m_{TWk}$, $m_{TBk}$, and $n_{TWk}$, $n_{TBk}$ represent plural kinetic energy levels of carriers flowing into the fourth layer, effective mass of carriers with . kinetic energy $E_{Tk}+V_T$ in the third layer, effective mass of carriers with kinetic energy $E_{Tk}$ in the fourth layer, and arbitrary even numbers, respectively.

The plurality of the partial quantum-wave interference layers $I_{Tk}$ are arranged in series from $I_{T1}$ to $I_{Tj}$, where j is a maximum number of k required to from a second quantum-wave interference layer as a whole.

A ninth aspect of the present invention is a semiconductor device having a first quantum-wave interference layer with a plurality of partial quantum-wave interference layers arranged in series with arbitrary periods. Each of the plurality of partial quantum-wave interference layers is constructed with serial pairs of the first and second layers. The widths of the first and second layers of the serial parts are represented by $(D_{RB1}, D_{RW1}), \ldots, (D_{RBk}, D_{RWk}), \ldots, (D_{RBj}, D_{RWj})$. $(D_{RBK}, D_{RWk})$ is a pair of widths of the first and second layers and is defined as Eqs 2-1 and 2-2, respectively.

A tenth aspect of the present invention is a semiconductor device having a second quantum-wave interference layer with a plurality of partial quantum-wave interference layers arranged in series with arbitrary periods. Each of the plurality of partial quantum-wave interference layers is constructed with-serial pairs of the third and fourth layers. The widths of the third and fourth layers of the serial parts are represented by $(D_{TB1}, D_{TW1}), \ldots, (D_{TBk}, D_{TWk}), (D_{TBj}, D_{TWj})$. $(D_{TBk}, D_{TWk})$ is a pair of widths of the third and fourth layers and is defined as Eqs.3-1 and 3-2, respectively.

An eleventh aspect of the present invention is to provide a first quantum-wave interference layer which functions as a reflection layer of carriers and a second quantum-wave interference layer which functions as a transmission layer of carriers.

A twelfth aspect of the present invention is to constitute a quantum-wave incident facet in the first quantum-wave interference layer by a second layer with enough thickness for preventing conduction of carriers by a tunneling effect.

A thirteenth aspect of the present invention is to form an emission layer between the first quantum-wave interference layer and the second quantum-wave interference layer. Other layers can exist at interfaces between the emission layer and the first quantum-wave interference layer and between the emission layer and the second quantum-wave interference layer.

A second characteristic group of this invention is a semiconductor device which comprises both of a pair of electron-wave interference layers and a pair of hole-wave interference layers as the pair of the first and the second quantum-wave interference layers described in the first characteristic group of the invention. Electron-waves and hole-waves are defined by quantum-waves of electrons and holes which flow in each layers of semiconductor, respectively.

A fourteenth aspect of the present invention is a semiconductor device comprising both a pair of electron-wave interference layers and a pair of hole-wave interference layers, each of which corresponds to a pair of the first and the second quantum-wave interference layers in the first aspect of the present invention. The electron-wave interference layer has a first electron-wave interference layer comprising a first and a second layers and a second electron-wave interference layer comprising a third and a fourth layers. The hole-wave interference layer has a first hole-wave interference layer comprising a fifth and a sixth layers and a second hole-wave interference layers comprising a seventh and an eighth layers. Carriers of the electron-wave interference layer and the hole-wave interference layer are electrons and holes, respectively.

A fifteenth aspect of the present invention comprises a pair of electron-wave interference layers and a pair of hole-wave interference layers corresponding to a pair of the first and the second quantum-wave interference layers of the second aspect of the present invention, respectively.

Sixteenth and eighteenth aspects of the present invention, which correspond to the third aspect of the present invention, are to form layers which vary energy bands sharply in the first electron-wave interference layer and the first hole-wave interference layer, respectively.

Seventeenth and nineteenth aspects of the present invention, which correspond to the fourth aspect of the present invention, are to form layers which vary energy bands sharply in the second electron-wave interference layer and the second hole-wave interference layer, respectively.

Twentieth and twenty-second aspects of the present invention, which correspond to the fifth aspect of the present invention, are to define each thickness of the first and the second layers in the first electron-wave interference layer and the fifth and the sixth layers in the first hole-wave interference layer by Eqs. 1-1 and 1-2, respectively. Here carriers in the first and the second layers in the first electron-wave interference layer are electrons and carriers in the fifth and the sixth layers in the first hole-wave interference layer are holes in the fifth aspect.

Twenty-first and twenty-third aspects of the present invention, which correspond to the sixth aspect of the present invention, are to define each thickness of the third and the fourth layers in the second electron-wave interference layer and the seventh and the eighth layers in the second hole-wave interference layer by Eqs. 1-3 and 1-4, respectively. Here carriers in the third and the fourth layers in the second electron-wave interference layer are electrons- and carriers in the seventh and the eighth layers in the second hole-wave interference layer are holes in the aspect of the sixth aspect.

Twenty-fourth and twenty-fifth aspects of the present invention, which correspond to the seventh aspect of the present invention, are to form a plurality of partial electron-wave interference layers and a plurality of partial hole-wave interference layers. The first electron-wave interference layer and the first hole-wave interference layer comprise respective partial electron-wave and hole-wave interference layers, each of which corresponds to the partial quantum-wave interference layers of the seventh aspect. Thicknesses of two kinds of component layers which construct the partial electron-wave and hole-wave layers are defined by Eqs. 2-1 and 2-2, respectively.

Twenty-sixth and twenty-seventh aspects of the present invention, which correspond to the eighth aspect of the present invention, are to form a plurality of partial electron-wave interference layers and a plurality of partial hole-wave interference layers. The second electron-wave interference layer and the second hole-wave interference layer comprise respective partial electron-wave and hole-wave interference layers, each of which corresponds to the partial quantum-wave interference layers of the eighth aspect. Thicknesses of two kinds of component layers which construct the partial electron-wave and hole wave interference layers are defined by Eqs. 3-1 and 3-2, respectively.

A twenty-eighth aspect of the present invention, , corresponding to the ninth aspect of the present invention, is to form the first electron-wave interference with a plurality of partial electron-wave interference layers arranged in series with arbitrary periods. A twenty-ninth aspect of the present invention, also corresponding to the ninth aspect of the present invention, is to form the first hole-wave interference layer with a plurality of partial hole-wave interference layers arranged in series with arbitrary periods. Each of the plurality of partial electron-wave interference layers is constructed with serial pairs of the first and second layers and each of the plurality of partial hole-wave interference layers is constructed with serial pairs of the fifth and sixth layers. The widths of the second and the first layers of the serial parts are represented by ($D_{eRBk}$, $D_{eRWk}$) which are defined as Eqs. 2-1 and 2-2 with respect to electrons. Also the widths of the sixth and the fifth layers of the serial parts are represented by ($D_{hRBk}$, $D_{hRWk}$) which are defined as Eqs. 2-1 and 2-2 with respect to holes.

A thirtieth aspect of the present invention, corresponding to the tenth aspect of the present invention, is to form the second electron-wave interference with a plurality of partial electron-wave interference layers arranged in series with arbitrary periods. A thirty-first aspect of the present invention, also corresponding to the tenth aspect of the present invention, is to form the second hole-wave interference layer with a plurality of partial hole-wave interference layers arranged in series with arbitrary periods. Each of the plurality of partial electron-wave interference layers is constructed with serial pairs of the third and fourth layers and each of the plurality of partial hole-wave interference layers is constructed with serial pairs of the seventh and eighth layers. The widths of the fourth and the third layers of the serial parts are represented by ($D_{eTBk}$, $D_{eTWk}$) which are defined as Eqs. 3-1 and 3-2 with respect to electrons. The widths of the eighth and the seventh layers of the serial parts are represented by ($D_{hTBk}$, $D_{hTWk}$) which are defined as Eqs. 3-1 and 3-2 with respect to holes.

A thirty-second aspect of the present invention, corresponding to the eleventh aspect of the present invention, is that the first and the second electron-wave interference layers function as an electron wave reflection layer and an electron wave transmission layer, respectively. A thirty-third aspect of the present invention, also corresponding to the eleventh aspect of the present invention, is that the first and the second hole-wave interference layers function as a hole wave reflection layer and a hole wave transmission layer, respectively.

A thirty-fourth aspect of the present invention, corresponding to the twelfth aspect of the present invention, is to constitute an electron-wave incident facet in the first electron-wave interference layer by second layer with enough thickness for preventing conduction of electrons by a tunneling effect. A thirty-fifth aspect of the present invention, also corresponding to the twelfth aspect of the present invention, is to constitute a hole-wave incident facet in the first hole-wave interference layer by a sixth layer with enough thickness for preventing conduction of holes by a tunneling effect.

A thirty-sixth aspect of the present invention, corresponding to the thirteenth aspect of the present invention, is to form an emission layer between the first and the second electron-wave interference layers. A thirty-seventh aspect of the present invention, also corresponding to the thirteenth aspect of the present invention, is to form an emission layer between the first and the second hole-wave interference layers.

(First, Second, Fifth, Sixth, Eleventh, Fourteenth, Fifteenth, Twentieth to Twenty-third, Thirty-second and Thirty-third Aspect of the Present Invention)

The principle of the first quantum-wave interference layer of the present invention is explained hereinafter. FIG. 1 shows a conduction band of a multiple layer structure with plural periods of a first layer W and a second layer B as a unit. A band gap of the second layer B is wider than that of the first layer W. Electrons conduct from left to right as shown by an. arrow in FIG. 1. Among the electrons, those that exist at the level near the lowest energy level of a conduction band in the second layer B are most likely to contribute to conduction. The electrons near the bottom of conduction band of the second layer B has a kinetic energy E. Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multiple layer structure.

When thicknesses of the first layer W and the second layer B are equal to order of quantum-wave wavelength, electrons tend to have characteristics of a wave. The wave length of the electron quantum-wave is calculated by Eqs. 1-1 and 1-2 using kinetic energy of the electron. Further, defining the respective wave number vector of first layer W and second layer B as $K_W$ and $K_B$, reflectivity R of the wave is calculated by:

$$R = (|K_W| - |K_B|)/(|K_W| + |K_B|) \tag{4}$$

$$= \left[\{m_W(E+V)\}^{\frac{1}{2}} - (m_B E)^{\frac{1}{2}}\right] / \left[\{m_W(E+V)\}^{\frac{1}{2}} + (m_B E)^{\frac{1}{2}}\right]$$

$$= \left[1 - \{m_B E/m_W(E+V)\}^{\frac{1}{2}}\right] / \left[1 + \{m_B E/m_W(E+V)\}^{\frac{1}{2}}\right].$$

Further, when $m_B = m_W$, the reflectivity R is calculated by:

$$R = [1 - \{E/(E+V)\}^{1/2}]/[1 + \{E/(E+V)\}^{1/2}]. \tag{5}$$

When $E/(E+V) = x$, Eq. 5 is transformed into:

$$R = (1 - x^{1/2})/(1 + x^{1/2}). \tag{6}$$

The characteristic of the reflectivity R with respect to the energy ratio x obtained by Eq. 6 is shown in FIG. 2. And when each of the second layer B and the first layer W is laminated S times, the reflectivity $R_S$ of the quantum-wave incident facet is calculated by:

$$R_S = [(1-x^S)/(1+x^S)]^2. \tag{7}$$

When the condition $x \leq 0.1$ is satisfied, $R \geq 0.52$. Accordingly, the relation between E and V is satisfied with:

$$E \leq V/9. \tag{8}$$

Since the kinetic energy E of the conducting electrons in the second layer B exists near the bottom of the conduction band, the relation of Eq. 8 is satisfied and the reflectivity R at the interface between the second layer B and the first layer W becomes 52% or more. Consequently, the multiple quantum well layer structure can reflect quantum wave of electrons effectively.

Further, utilizing the energy ratio x enables the thickness ratio $D_B/D_W$ of the second layer B to the first layer W to be obtained by:

$$D_B/D_W = [m_W(m_B x)]^{1/2}. \tag{9}$$

Thicknesses of the first layer W and the second layer B are determined for selectively transmitting one of holes and electrons, because of a difference in potential energy between the valence and the conduction bands, and a difference in effective mass of holes and electrons in the first layer W and the second layer B. Namely, the optimum thickness of the first and the second layers for reflecting electrons is not optimum for reflecting holes. Eqs. 1-1 and 1-2 refer to a structure of the quantum-wave interference layer for reflecting electrons selectively. The thickness for selectively reflecting electrons is designed based on a difference in potential energy of the conduction band and effective mass of electrons. Consequently, the quantum-wave interference layer has a high reflectivity for electrons, but not for holes.

Further, the thickness for selectively reflecting holes is designed based on a difference in potential energy of the valence band and effective mass of holes, realizing another type of quantum-wave interference layer which can reflect holes and transmits electrons.

The principle of the second quantum-wave interference layer of the present invention is explained hereinafter. When thicknesses of the third layer W and the fourth layer B are determined by multiplying an even number by one fourth of a quantum-wave wavelength, for example, a half of a quantum-wave wavelength, a standing wave rises in a quantum-wave interference layer, and a resonant conduction is occurred. That is, when a quantum-wave period of the standing wave and a potential period of the quantum-wave interference layer is corresponded to each other, a scattering of the carrier in each layer is suppressed, and a conduction of a high mobility is realized.

Thicknesses of the third layer W and the fourth layer B are determined for selectively transmitting one of holes and electrons, because of a difference in potential energy between the valence and the conduction bands, and a difference in effective mass of holes and electrons in the third layer W and the fourth layer B. Namely, the optimum thickness of the third and the fourth layers for transmitting electrons is not optimum for transmitting holes. Eqs. 1-3 and 1-4 refer to a structure of the quantum-wave interference layer for transmitting electrons selectively. The thickness for selectively transmitting electrons is designed based on a difference in potential energy of the conduction band and effective mass of electrons. Consequently, the quantum-wave interference layer has a high transmittivity (or a high mobility) for electrons, but not for holes.

Further, the thickness for selectively transmitting holes is designed based on a difference in potential energy of the valence band and effective mass of holes, realizing another type of quantum-wave interference layer as a hole-wave transmission layer, which has a high mobility for holes and which has an ordinary mobility for electrons.

Further explanation can be obtained by FIGS. 3A–3H. FIGS. 3A–3H illustrate the relationship between reflection of quantum-wave of electrons in a potential of quantum-well structure and a period of potential representing a conduction band of a multiple quantum well (MQW). FIGS. 3A–3D show the relationship when the period, i.e., width of the fourth layer B or the third layer W, of the potential is equal to an odd number multiplied by one fourth of the wavelength of propagated election quantum-wave. This type of the potential is named as λ/4 type potential hereinafter. FIGS. 3E–3H show when the period of the potential is equal to a natural number multiplied by a half of the wavelength of propagated electron quantum-wave. This type of the potential is named as λ/2 type potential hereinafter. In order to make it visually intelligible, thickness of each layers is unified in FIGS. 3A–3H. Electrons existing around the bottom of a conduction band of the fourth layer B conduct from left to right as shown by an arrow in FIGS. 3A and 3E. And in FIGS. 3B and 3F, the electrons reach the interface between the third layer W and the fourth layer B.

When the quantum-wave of th e electrons reaches the interface between the fourth layer B and the third layer W in the λ/4 type potential, a transmission wave QW2 and a reflection wave QW3 having a phase equal to that of the transmission wave QW2, are generated with respect to an incident wave QW1 as shown in FIG. 3C. Then when the transmission wave QW2 reaches the interface between the third layer W and the fourth layer B, a transmission wave QW4 and a reflection wave QW5 having a phase opposite to that of the transmission wave QW4 are generated as shown in FIG. 3D. The relationship between phases of the transmission wave and the reflection wave at the interface depends on falling or rising of a potential of the conduction band at the interface. In order to make it visually intelligible, each amplitudes of QW1, QW2, QW3, QW4, and QW5 is unified in FIGS. 3A–3H.

With respect to the λ/4 type potential of the multiple quantum well, the propagating quantum-wave of electrons represented by QW1, QW2 and QW4 and the reflecting quantum-wave of electrons represented by QW3 and QW5 cancels with each other, as shown in FIG. 3D. The quantum-wave of electrons rep resented by the QW1, QW2 and QW4 propagates from left to right, and the quantum-wave of electrons represented by the QW3 and QW5, generated by the reflection at two interfaces, propagates from right to left. Accordingly, a multiple quantum well, having a potential which is formed in a period, i.e., the width of the third layer W and the fourth layer B, determined by multiplying by an odd number one fourth of quantum-wave wavelength of propagated electrons cancels the quantum-wave of electrons. In short, the multiple quantum well functions as a reflection layer which does not propagate electrons.

With respect to a multiple quantum well, having a potential which is formed in a period, i.e., the width of the third layer W and the fourth layer B, determined by multiplying by an even number one fourth of quantum-wave. wavelength of propagated electrons, i.e., λ/2 type potential, as shown in FIGS. 3E–3H, the quantum-wave of electrons can become a standing wave.

Similarly, when a quantum-wave of electrons reaches the interface between the fourth layer B and the third layer W in the λ/2 type potential, a transmission wave QW2 and a reflection wave QW3 having a phase corresponding to that of the transmission wave QW2, are generated with respect to an incident wave QW1 as shown in FIG. 3G. Then when the transmission wave QW2 reaches the interface between the third layer W and the fourth layer B, a transmission wave QW4 and a reflection wave QW5 having a phase opposite to that of the transmission wave QW4 are generated as shown in FIG. 3H. With respect to λ/2 type potential of the multiple quantum well, the propagating quantum-wave of electrons represented by QW1, QW2 and QW4 and the reflecting quantum-wave of electrons represented by QW5 intensifies to each other, as shown in FIG. 3H. On the other hand, the reflection waves QW3 and QW5 can be considered to cancel with each other and the quantum-wave of electrons which is propagated from left to right in FIG. .3E can be a standing wave. Accordingly, with respect to the multiple quantum well, having a potential which is formed in a period, i.e., the width of the third layer W and the fourth layer B, determined by multiplying by an even number one fourth of quantum-wave wavelength of propagated electrons, the quantum-wave of electrons can become a standing wave and a transmission layer having a high transmittivity. (or a high mobility) for electrons can be realized.

Alternatively, a multiple quantum well, having a potential which is formed in a period determined by multiplying by a natural number half of quantum-wave wavelength of holes, can be applied to the relationship described above.

Accordingly, a semiconductor device in which a pair of a first and a second quantum-wave interference layers to one of electrons and holes, are formed as described above is obtained. When electrons or holes are injected from the second quantum-wave interference layer to the first quantum-wave interference layer, electrons or holes, which are not interrupted and flows with a high transmittivity in the second quantum-wave interference layer, reach the first quantum-wave interference layer and are reflected effectively. In short, carriers (electrons or holes) can be accumulated effectively between the second and the first quantum-wave interference layer and also a main part to function the device can be formed between the second and the first quantum-wave interference layer. Accordingly, a semiconductor layer in the present invention comprising a pair of a first and A second quantum-wave interference layer for electrons or holes enables to considerably improve the efficiency of the device compared with conventional semiconductor devices and has a completely new structure. This characteristic appears more remarkably with respect to a semiconductor device comprising a pair of a first and a second quantum-wave interference layers for electrons another pair for holes. Such a device can be used as a diode, a bipolar transistor, a light-emitting diode or a laser.

(Third, Fourth, Sixteenth and Nineteenth Aspect of the Present Invention)

FIGS. 4A–4D illustrate to form a $\delta_R$ layer (disclosed as a δ layer in FIGS. 4A–4D) at the interface between the first layer W and the second layer B. The $\delta_R$ layer has a relatively thinner thickness than both of the first layer W and the second layer B and sharply varies an energy band. By sharply varying the band gap of the interfaces, the potential energy V of an energy band becomes larger substantially and the value x of Eq. 6 becomes smaller, as shown in FIGS. 4A–4D. This is shown in FIGS. 5A–5D. Without forming a $\delta_R$ layer as shown in FIG. 5A, a part of component of the first layer W and the second layer B mixes when the second layer B is laminated on the first layer W, and an energy band gap which varies sharply cannot be obtained, as shown in FIG. 5B. When a $\delta_R$ layer is formed at each interfaces of the first and the second layers as shown in FIG. 5C, even if a pair of component of the first layer W and the second layer B mixes, an energy band gap varies sharply compared with the case without $\delta_R$ layers, as shown in FIG. 5D.

Variations are shown in FIGS. 4A to 4D. The $\delta_R$ layer may be formed on both ends of the every first layer W as shown in FIGS. 4A to 4D. In FIG. 4A, the $\delta_R$ layers are formed so that an energy level higher than that of the second layer B may be formed. In FIG. 4B, the $\delta_R$ layers are formed so that a band having lower bottom than that of the first layer W may be formed. In FIG. 4C. the $\delta_R$ layers are formed so that the energy level higher than that of the second layer B and the energy level lower than that of the first layer W may be formed. As an alternative to the variation shown in FIG. 4C, the $\delta_R$ layer can be formed on only either one end of every layer as shown in FIG. 4D.

A $\delta_T$ layer can be formed at the interface between the third layer W and the fourth layer B. The $\delta_T$ layer which has a relatively thinner thickness than both of the third layer W and the fourth layer B and sharply varies an energy band has the same effect as that of the $\delta_R$ layer formed at the interface between the first layer W and the second layer B. The $\delta_T$ layer may be formed in one of a plural quantum-wave interference layers or may be formed in all of the layers.

(Seventh, Eighth, Twenty-fourth to Twenty-seventh Aspects of the Present Invention)

As shown in FIG. 6, a plurality of partial quantum-wave interference layers $I_{Rk}$ as the first quantum-wave interference layer, the first electron-wave interference layer or the first hole-wave interference layer may be formed corresponding to each of a plurality of kinetic energy levels $E_{Rk}$. Each of the partial quantum-wave interference layers $I_{Rk}$ has $T_{Rk}$ periods of a first layer W and a second layer B as a unit whose respective thicknesses ($D_{RWk}$, $D_{RBk}$) are determined by Eqs. 2-1 and 2-2. The. plurality of the partial quantum-wave interference layer $I_{Rk}$ is arranged in series with respect to the number k of kinetic energy levels $E_{Rk}$. That is, the quantum-wave interference layer is formed by a serial connection of $I_{R1}$, $I_{R2}$, . . . , and $I_{Rj}$. As shown in FIG. 6, electrons with each of the kinetic energy levels $E_{Rk}$ are reflected by the corresponding partial quantum-wave interference layers $I_{Rj}$. Accordingly, electrons belonging to each of the kinetic energy levels from $E_{R1}$ to $E_{Rj}$ are reflected effectively. By designing the intervals between the kinetic energies to be short, thicknesses of the first layer W and the second layer B ($D_{RWk}$, $D_{RBk}$) in each of the partial quantum-wave interference layers $I_{Rk}$ vary continuously with respect to the value k. Similarly, a plurality of partial quantum-wave interference layers $I_{Tk}$ may be formed corresponding to each of a plurality of kinetic energy levels $E_{Tk}$. Each of the partial quantum-wave interference layers $I_{Tk}$ has $T_{Tk}$ periods of a first layer W and a second layer B as a unit whose respective thicknesses ($D_{TWk}$, $D_{TBk}$) are determined by Eqs. 3-1 and 3-2. The plurality of the partial quantum-wave interference layer $I_{Tk}$ is arranged in series with respect to the number k of kinetic energy levels $E_{Tk}$. That is, the quantum-wave interference layer is formed by a serial connection of $I_{T1}$, $I_{T2}$, . . . , and $I_{Tj}$. This quantum-wave interference layer becomes to have a high transmittivity (or a high mobility). with carriers. In FIG. 6, ($D_{RBk}$, $D_{RBk}$), $I_{Rk}$, and $T_{Rk}$ are not distinguished from ($D_{TWk}$, $D_{TBk}$), $I_{Tk}$, and $T_{Tk}$, respectively, and each of them is represented by $D_{Wk}$, $D_{Bk}$, $I_k$ and $T_k$.

The structure described above may be applied to either a first or a second quantum-wave interference layer in a semiconductor device which comprises the first and the second quantum-wave interference layers. Alternatively, the structure may be applied to both of the first and the second quantum-wave interference layers. The structure may also be applied to one of a first and a second electron-wave interference layers and a first and a second hole-wave interference layers. Alternatively, a plural numbers or all of these layers can have the structure.

(Ninth, Tenth, and Twenty-eighth to Thirty-first Aspects of the Present Invention)

As shown in FIG. 7, a plurality of partial quantum-wave interference layers may be formed with an, arbitrary period as the first quantum-wave interference layer, the first electron-wave interference layer or the first hole-wave interference layer. Each of the partial quantum-wave interference layers $I_{R1}$, $I_{R2}$, . . . is made of serial pairs of the first layer W and the second layer B with widths ($D_{RWk}$, $D_{RBk}$) determined by Eqs. 2-1 and 2-2. That is, the partial quantum-wave -interference layer, e.g., $I_{R1}$, is constructed with serial layers of width ($D_{RW1}$, $D_{RB1}$), . . . , ($D_{RWk}$, $D_{RBK}$), . . . , ($D_{RWj}$, $D_{RBj}$). A plurality $I_{R1}$, $I_{R2}$, . . . of layers such as $I_{R1}$ are connected in series to form the total quantum-wave interference layer. Accordingly, electrons of the plurality of kinetic energy levels $E_{Rk}$ are reflected by each pair of layers in each partial quantum-wave interference layers. By designing the intervals between kinetic energies to be short, thicknesses of the pair of the first layer W and the second layer B ($D_{RWk}$, $D_{RBk}$) in a certain partial quantum-wave interference layer $I_{Rk}$ varies continuously with respect to the value k. Similarly, a plurality of partial quantum-wave interference layers, each of which is made of serial pairs of the first layer W and the second layer B with widths ($D_{TWk}$, $D_{TBk}$) determined by Eqs. 3-1 and 3-2, may be formed with an arbitrary period as the second quantum-wave interference layer, the second electron-wave interference layer or the second hole-wave interference layer. That is, the partial quantum-wave interference layer is constructed with serial layers of width ($D_{TW1}$, $D_{TB1}$), . . . , ($D_{TWk}$, $D_{TBk}$), . . . , ($D_{TWj}$, $D_{TBj}$). This quantum-wave interference layer becomes to have a high transmittivity (or a high mobility) with carriers. In FIG. 7, ($D_{RWk}$, $D_{RBk}$), $I_{Rk}$, and $T_{Rk}$ are not distinguished from ($D_{TWk}$, $D_{TBk}$), $I_{Tk}$, and $T_{Tk}$, respectively, and each of them is represented by $D_{Wk}$, $D_{Bk}$, $I_k$ and $T_k$.

The structure described above may be applied to either a first or a second quantum-wave interference layer in a semiconductor -device which comprises the first and the second quantum-wave interference layers. Alternatively, the structure may be applied to both of the first and the second. quantum-wave interference layers. The structure may also be applied to one of a first and a second electron-wave interference layers and a first and a second hole-wave interference layers. Alternatively, a plural numbers or all of these layers can have the structure.

(Twelfth, Thirty-fourth, and Thirty-fifth Aspects of the Present Invention)

By forming a thick second layer $B_{R0}$ or $B_{eR0}$ at the side of an incident plane of the quantum-wave interference layer, resonance tunneling conduction can be prevented effectively and carriers are reflected effectively. Similarly, forming a thick second layer $B_{eR0}$ and a fifth layer $B_{hR0}$ at the side of an incident plane of a first electron-wave interference layer and a first hole-wave interference layer, respectively, has the same effect. In FIG. 1, layers $B_{eR0}$ and $B_{hR0}$ are represented by $B_0$.

(Thirteenth, Thirty-sixth and Thirty-seventh Aspects of the Present Invention)

When an emission layer is formed between the first and the second quantum-wave interference layers, carriers tend to be accumulated easily in the emission layer and a luminous efficiency increases. These layers are useful for a light-emitting diode, a laser diode and a photocoupler or other light-emitting device comprising an LED or an LD. When an emission layer is formed between the first and the second quantum-wave interference layers for electrons and between the first and the second quantum-wave interference layers for holes, a luminous efficiency increases more. This emission layer may contact to either the first or the second quantum-wave interference layer for electrons or may contact to either the first or the second quantum-wave interference layer for holes. It may not contact to any of the first or the second quantum-wave interference layer for electrons or holes. Other functional layers may be formed adjacent to the emission layer if necessary.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, where in:

DETAILED DESCRIPTION OF THE PREFERRED EMBODIMENTS

The invention will be more fully understood by reference to the following examples.

EXAMPLE 1

Figure 1:
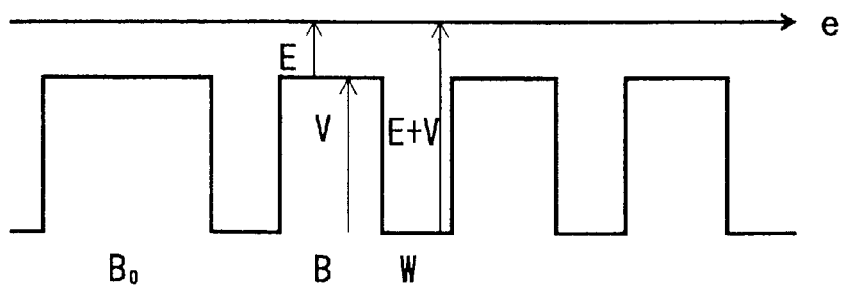
FIG. 1 is an explanatory view of a conduction band of a quantum-wave interference layer of the present invention.
Figure 2:
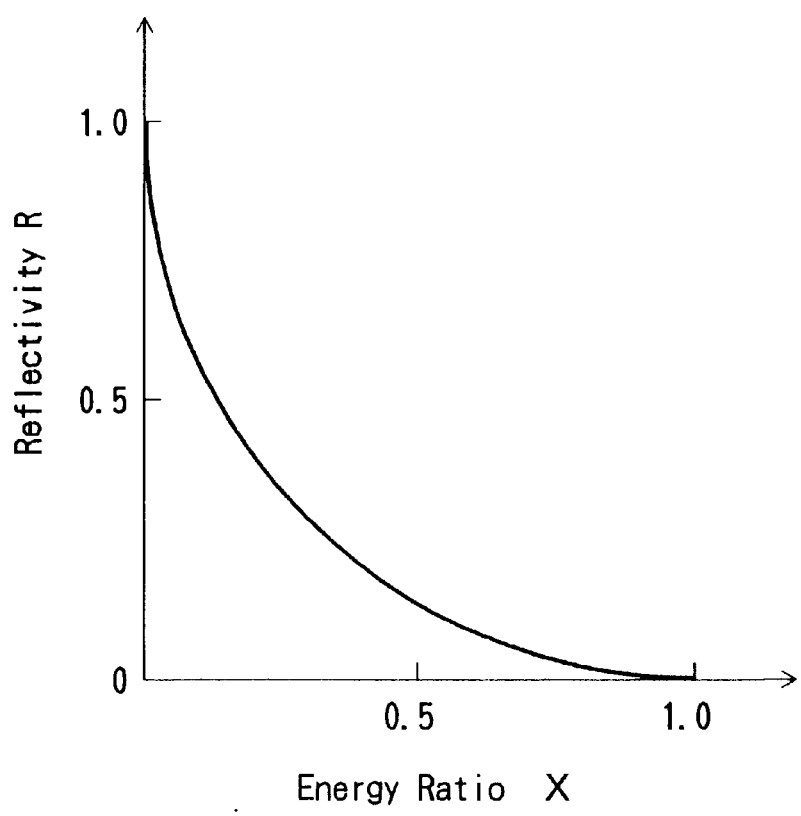
FIG. 2 is a graph showing a relation between an energy ratio x and a reflectivity R.
Figure 3A:
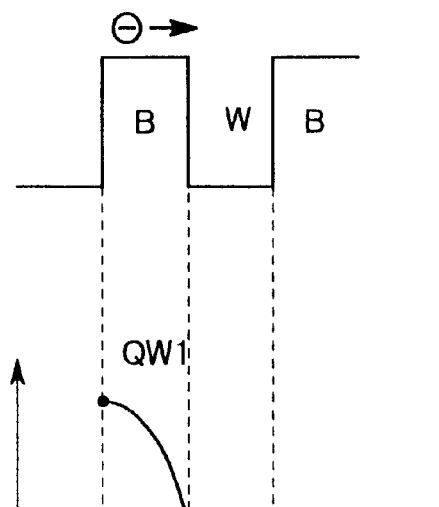
FIGS. 3A–3D are explanatory views of a quantum-wave interference layer as a reflection layer of carriers.
Figure 3B:
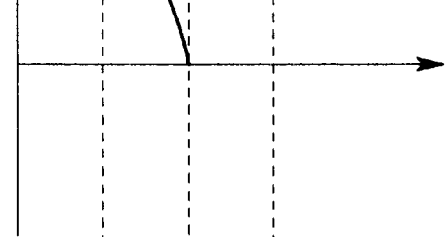
Figure 3C:
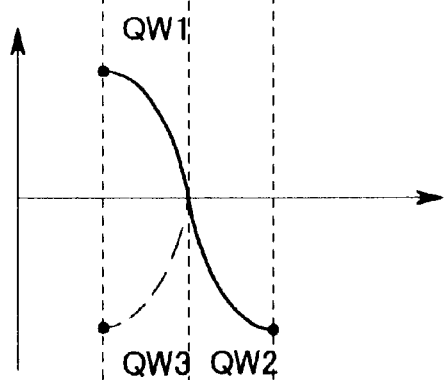
Figure 3D:
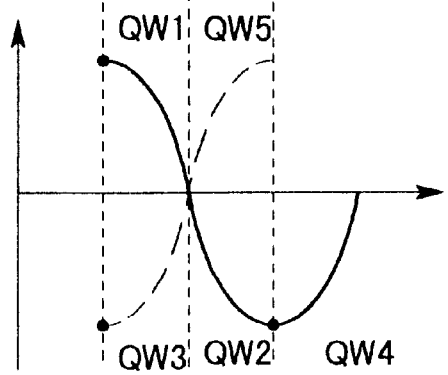
Figure 3E:
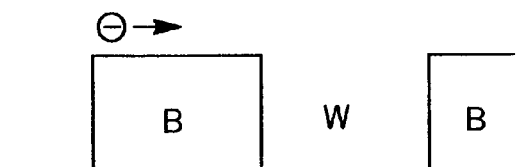
FIGS. 3E–3H are explanatory views of a quantum-wave interference layer as a transmission layer of carriers.
Figure 3F:
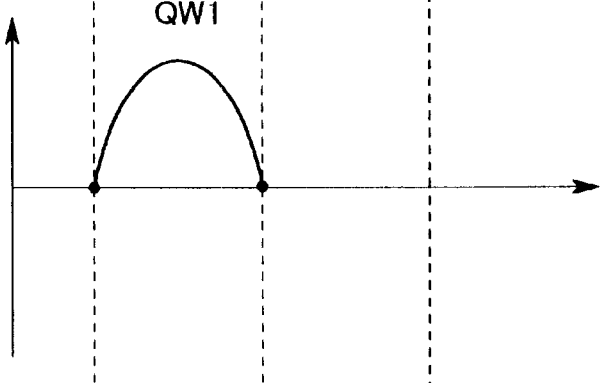
Figure 3G:
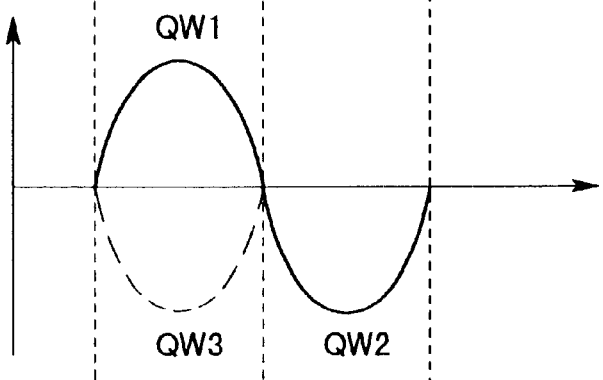
Figure 3H:
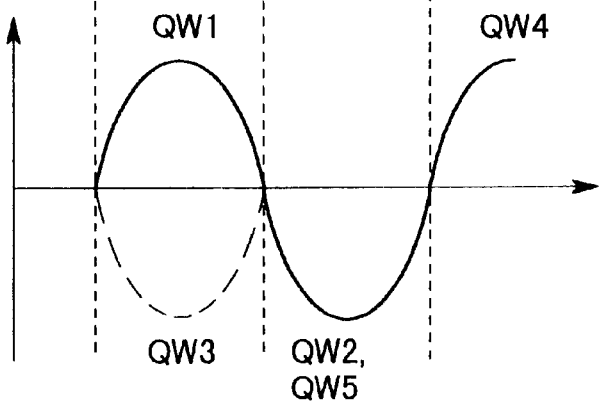
Figure 4A:
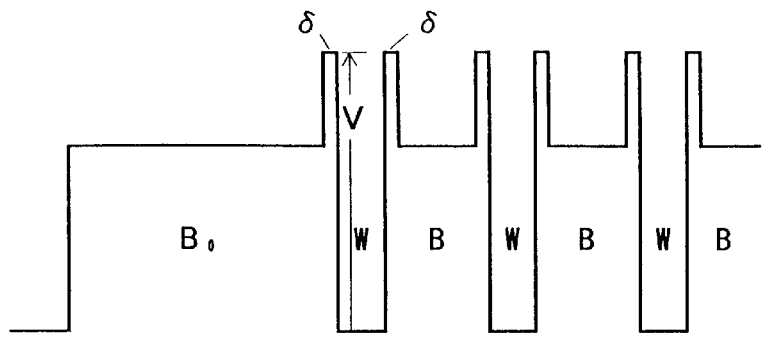
FIGS. 4A–4D are explanatory views of configurations of δ layers according to the present invention.
Figure 4B:
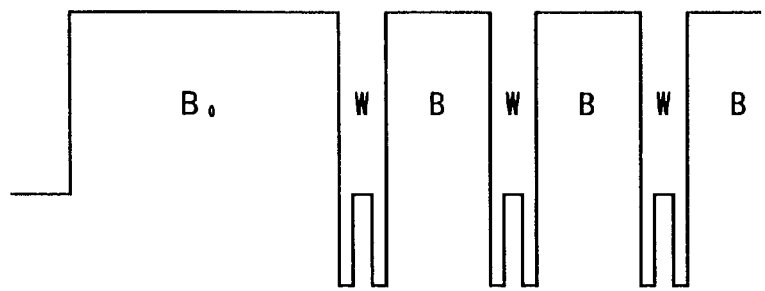
Figure 4C:
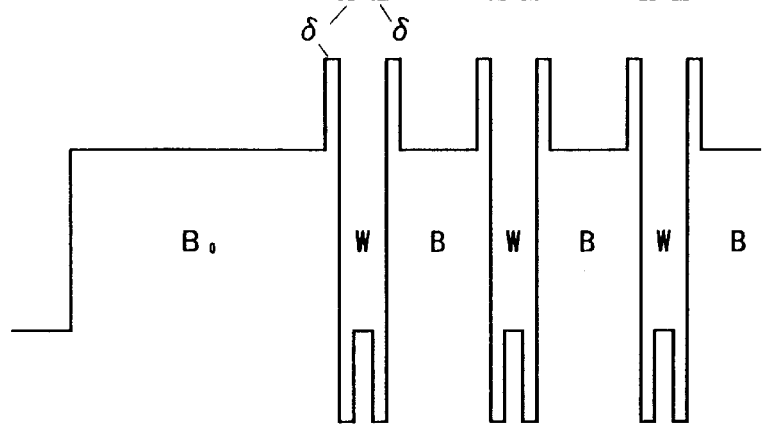
Figure 4D:
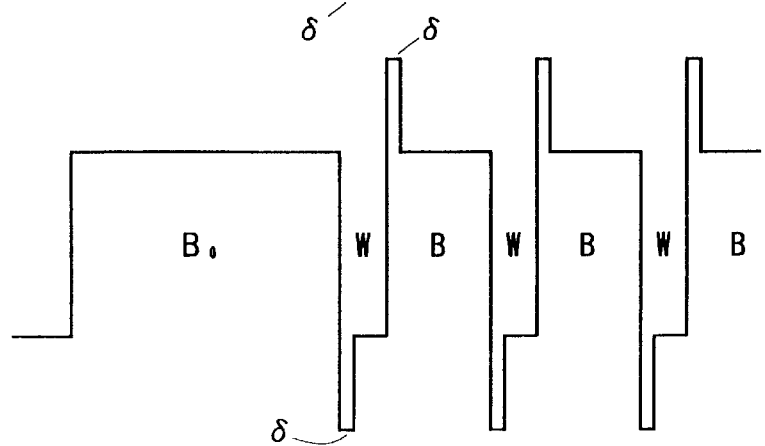
Figure 5A:
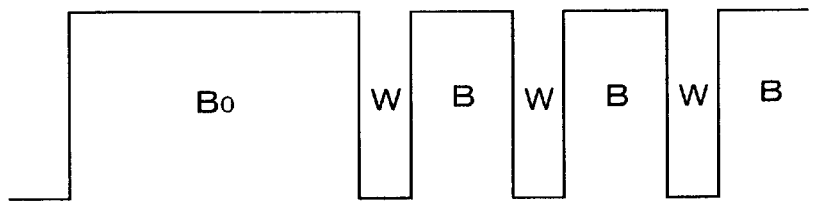
FIGS. 5A–5D are views showing energy level for explaining a function of δ layers according to the present invention.
Figure 5B:
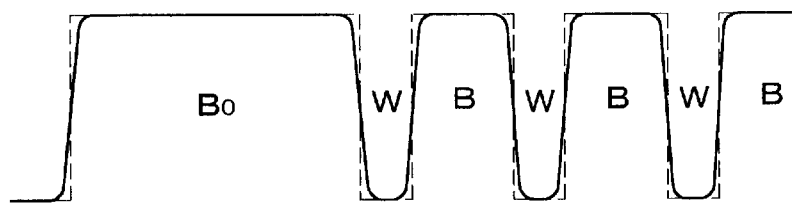
Figure 5C:
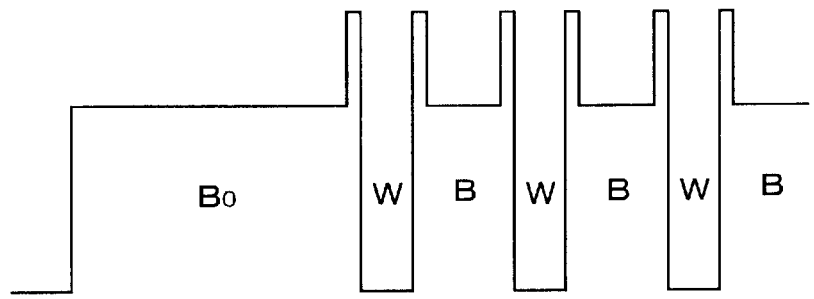
Figure 5D:
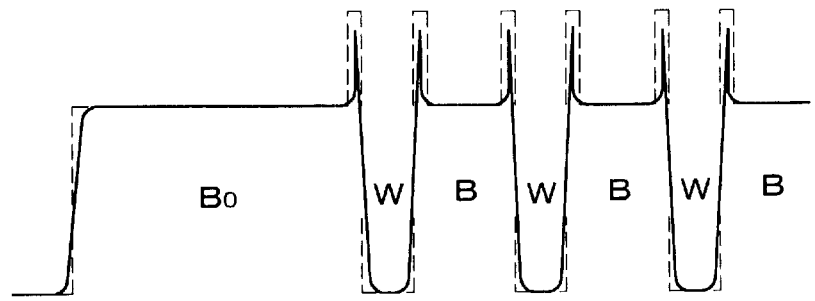
Figure 6:
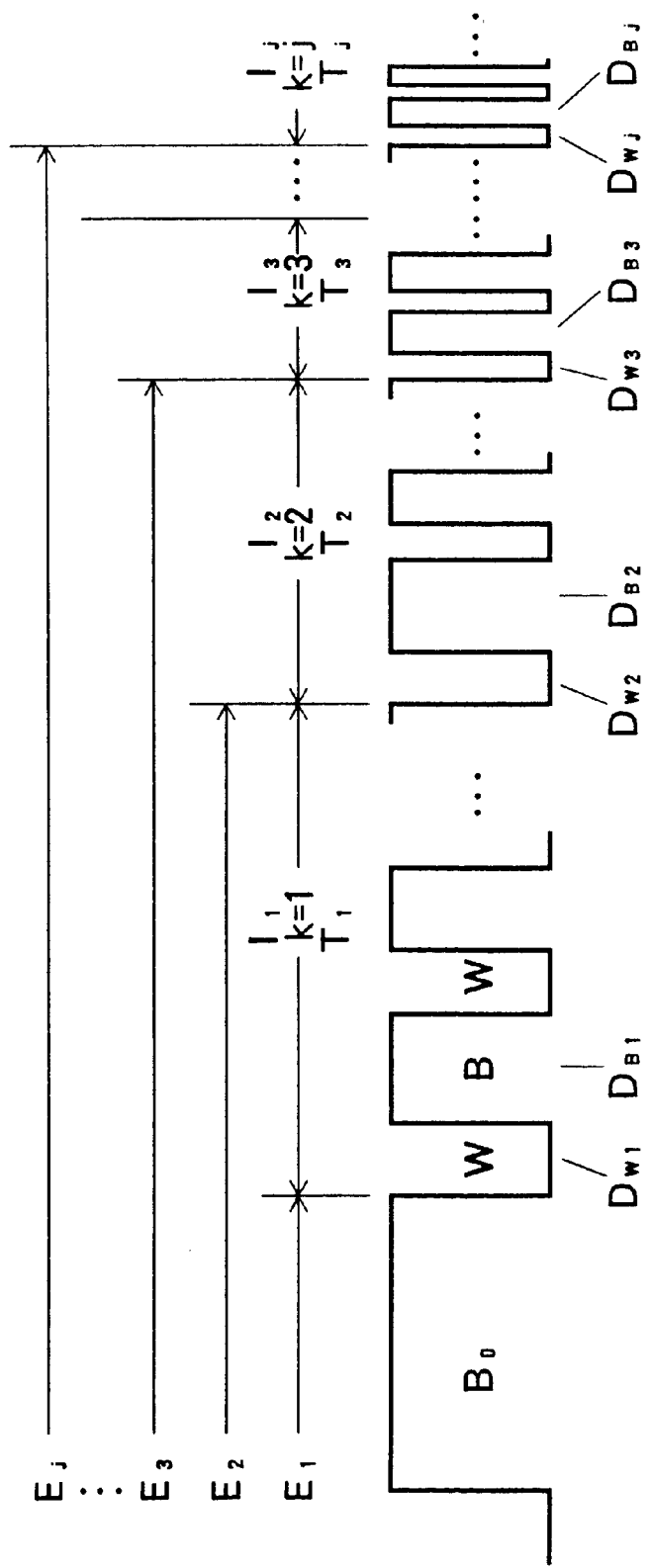
FIG. 6 is an explanatory view of partial quantum-wave interference layers $I_k$ according to the present invention.
Figure 7:
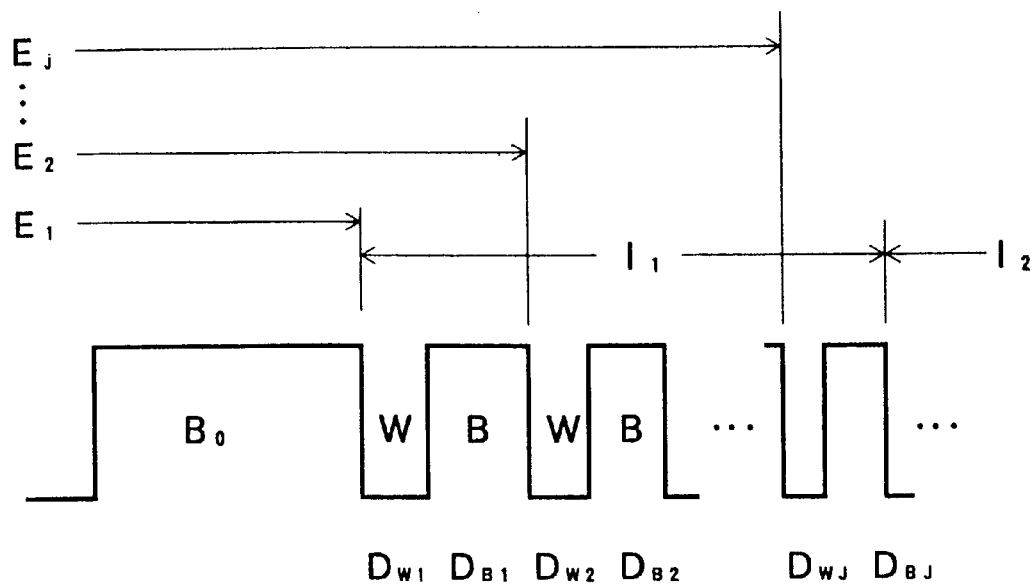
FIG. 7 is an explanatory view of partial quantum-wave interference layers $I_k$ according to the present invention.
Figure 8:
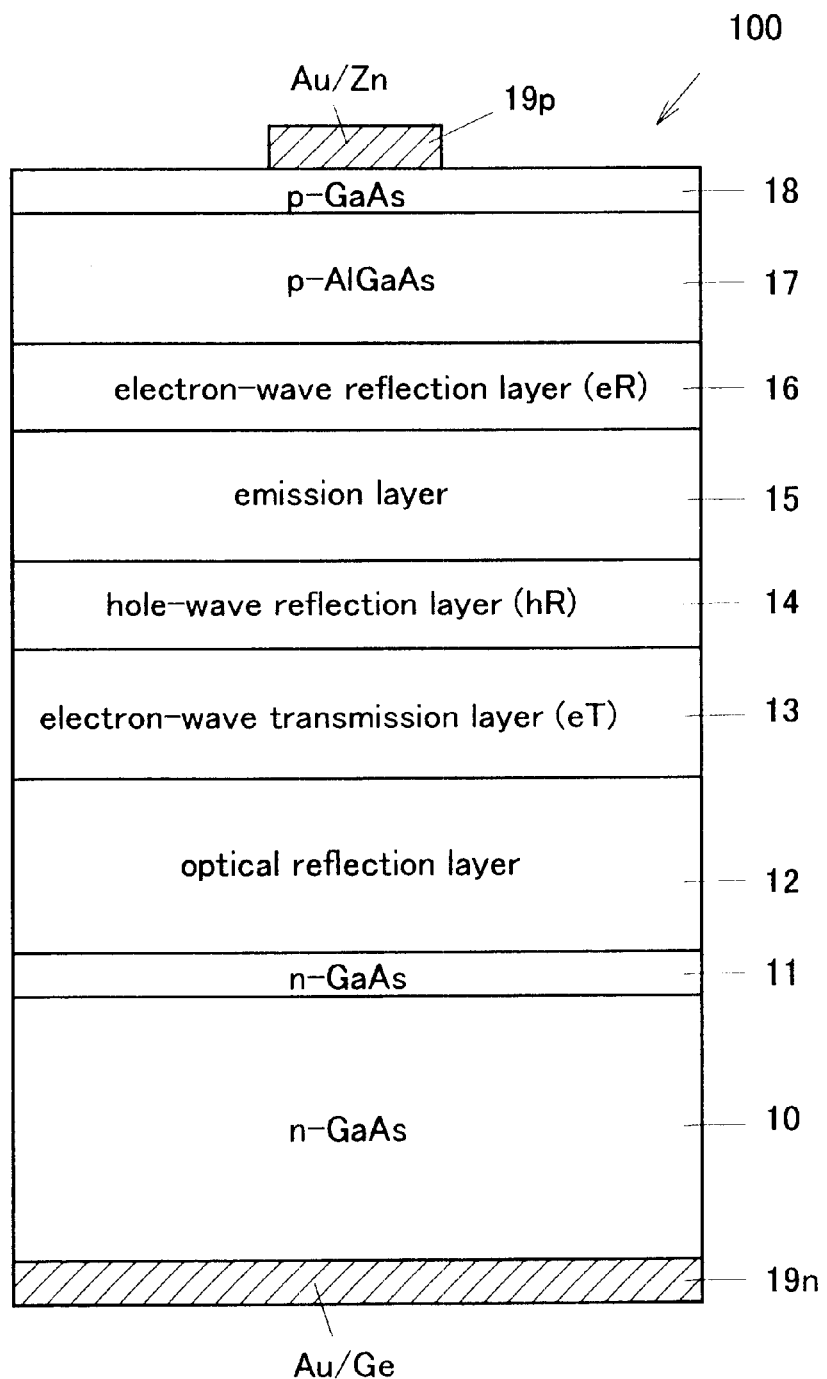
FIG. 8 is a sectional view showing a structure of a light-emitting diode 100 according to the first embodiment of the present invention.

FIG. 8 is a sectional view of a light-emitting diode 100 comprising one quantum-wave interference layer on a p-type layer side and two quantum-wave interference layers on an n-type layer side. The light-emitting device 100 has a substrate 10 made of gallium arsenide (GaAs). A GaAs buffer layer 11 of n-type conduction, having a thickness generally of 0.3 $\mu$m and an electron concentration of $2\times10^{18}/cm^3$, is formed on the substrate 10. An optical reflection layer 12, which has a thickness of about 3 $\mu$m and has a multiple layer structure comprising 25 pairs of an n-GaAs layer and an n-$Al_{0.5}Ga_{0.5}As$ layer, is formed on the buffer layer 11. The n-GaAs layer has a thickness of 55 nm and an electron concentration of $2\times10^{18}/cm^3$, and the n-$Al_{0.5}Ga_{0.5}As$ layer has a thickness of 63 nm and an electron concentration of $2\times10^{18}/cm^3$.

An electron-wave transmission layer (eT) 13, which has a thickness of about 0.6$\mu$m and has a multiple layer structure comprising 20 pairs of an n-GaAs layer and an n-$Al_{0.5}Ga_{0.5}As$ layer, is formed on the optical reflection layer 12. The n-GaAs layer has a thickness of 10 nm and an electron concentration of $1\times10^{18}/cm^3$, and the n-$Al_{0.5}Ga_{0.5}As$ layer has a thickness of 22 nm and an electron concentration of $1\times10^{18}/cm^3$.

A hole-wave: reflection layer (hR) 14, which has a thickness of about 20 nm and has a multiple layer structure comprising 10 pairs of an n-GaAs and an n-$Al_{0.5}Ga_{0.5}As$ layer, is formed on the electron-wave transmission layer (eT) 13. The n-GaAs layer has a thickness of 1 nm and an electron concentration of $1\times10^{18}/cm^3$, and the n-$Al_{0.5}Ga_{0.5}As$ layer has a thickness of 1.2 nm and an electron concentration of $1\times10^{18}/cm^3$.

An emission 15 having a multiple layer structure is formed on the hole-wave reflection layer (hR) 14. The following layers are laminated in the emission layer 15 on the hole-wave reflection layer (hR) 14 in sequence: a non-doped i-$Al_{0.5}Ga_{0.5}As$ layer having a thickness of 50 nm; a non-doped i-$Ga_{0.89}In_{0.11}As$ layer having a thickness of 14.5 nm; a non-doped i-$Al_{0.5}Ga_{0.5}As$ layer having a thickness of 3 nm; a non-doped i-$Ga_{0.89}In_{0.11}As$ layer having a thickness of 14.5 nm; a non-doped i-$Al_{0.5}Ga_{0.5}As$ layer having a thickness of 3 nm; a non-doped i-$Ga_{0.89}In_{011}As$ layer having a thickness of 14.nm; and a non-doped i-$Al_{0.5}Ga_{0.5}As$ layer having a thickness of 50 nm. The i-$Ga_{0.89}In_{0.11}As$ layer is a well layer and the i-$Al_{0.5}Ga_{0.5}As$ layer is a barrier layer. Accordingly, the emission layer 15 has a multiple quantum well (MQW) structure, and has a thickness of about 0.15 $\mu$m.

An electron-wave reflection layer (eR) 16, which has a thickness of about 0.3 $\mu$m and has a multiple layer structure comprising 20 pairs of a p-GaAs and a p-$Al_{0.5}Ga_{0.5}As$ layer, is formed on the emission layer 15. The p-GaAs layer has a thickness of 5 nm and a hole concentration of $1\times10^{18}/cm^3{}_1$, and the p-$Al_{0.5}Ga_{0.5}As$ layer has a thickness of 11 nm and a hole concentration of $1\times10^{8}/cm^3$.

A p-cladding layer 17 of p-$Al_{0.5}Ga_{0.5}As$, having a hole concentration of $1\times10^{18}/cm^3$ and a thickness of about 0.5 $\mu$m, is formed on the electron-wave reflection (eR). layer 16. A p-contact layer 18 of p-GaAs, having a hole concentration of $2\times10^{18}/cm^3$ and a thickness of about 30 nm, is formed on the p-cladding layer 17. An electrode layer 19n made of gold and germanium (Au/Ge), having a thickness generally of 0.2 $\mu$m, is formed so as to cover the entire back of the substrate 10. Another electrode layer 19p made of Au/Zn, having a thickness generally of 0.2 $\mu$m, is formed on some portion of the p-contact layer 18. And the substrate 10 has a diameter of 2.0 inches and the normal direction of its main surface is offset toward the [011] axis by 15 degree from the (100) plane.

The light-emitting diode 100 was manufactured by gas source molecular beam epitaxial deposition (GS-MBE) which is an epitaxial growth method under extremely high vacuum condition. GS-MBE is different from a conventional MBE which supplies group III and V elements both from solid state sources. In GS-MBE, group III elements such as indium (In), gallium (Ga), and aluminum (Al) are supplied from a solid source and group V elements such as arsenic (As) and phosphorous (P) are supplied by heat decomposition of gas material such as $AsH_3$ and $PH_3$. Alternatively, the light-emitting diode 100 can be manufactured by metal organic chemical vapor deposition (MOCVD).

Figure 9:
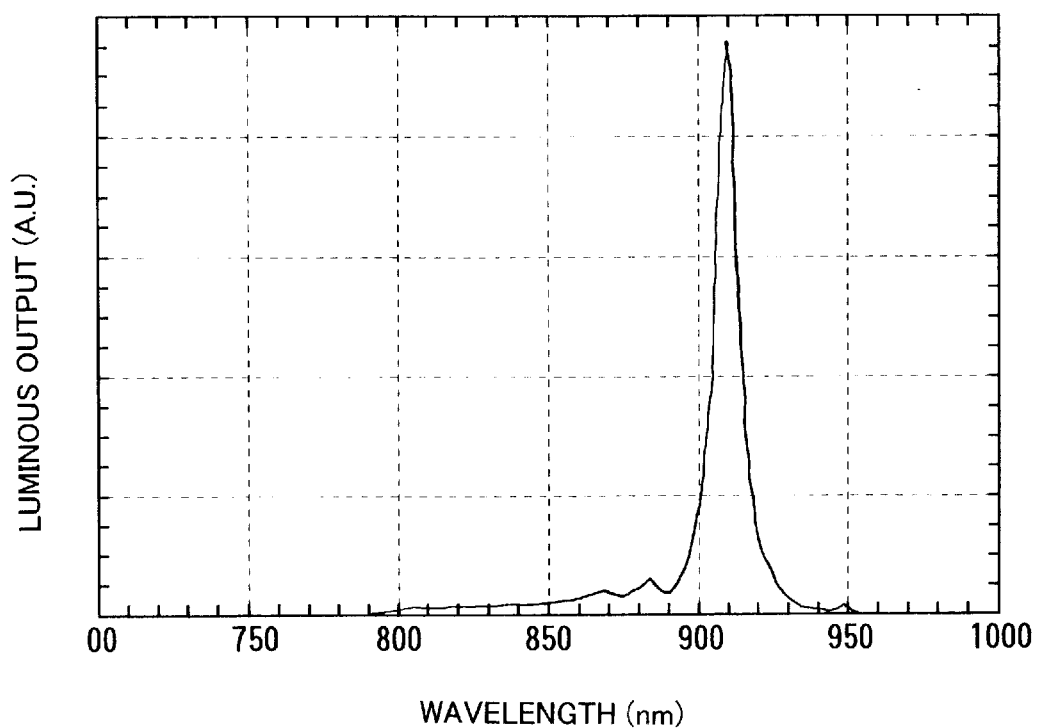
FIG. 9 is a graph showing luminous characteristics of the light-emitting diode 100 according to the first embodiment of the present invention.

FIG. 9 is a graph showing luminous characteristics of the light-emitting diode 100. A luminous wavelength was 908 nm and half-width was 12 nm. A photocoupler formed by coupling the light-emitting diode 100 and a photodiode has a frequency response characteristics of 100 to 200 MHz, which is considerably largerthan a frequency response characteristics of a commercial product, 20 MHz.

EXAMPLE 2

Figure 10:
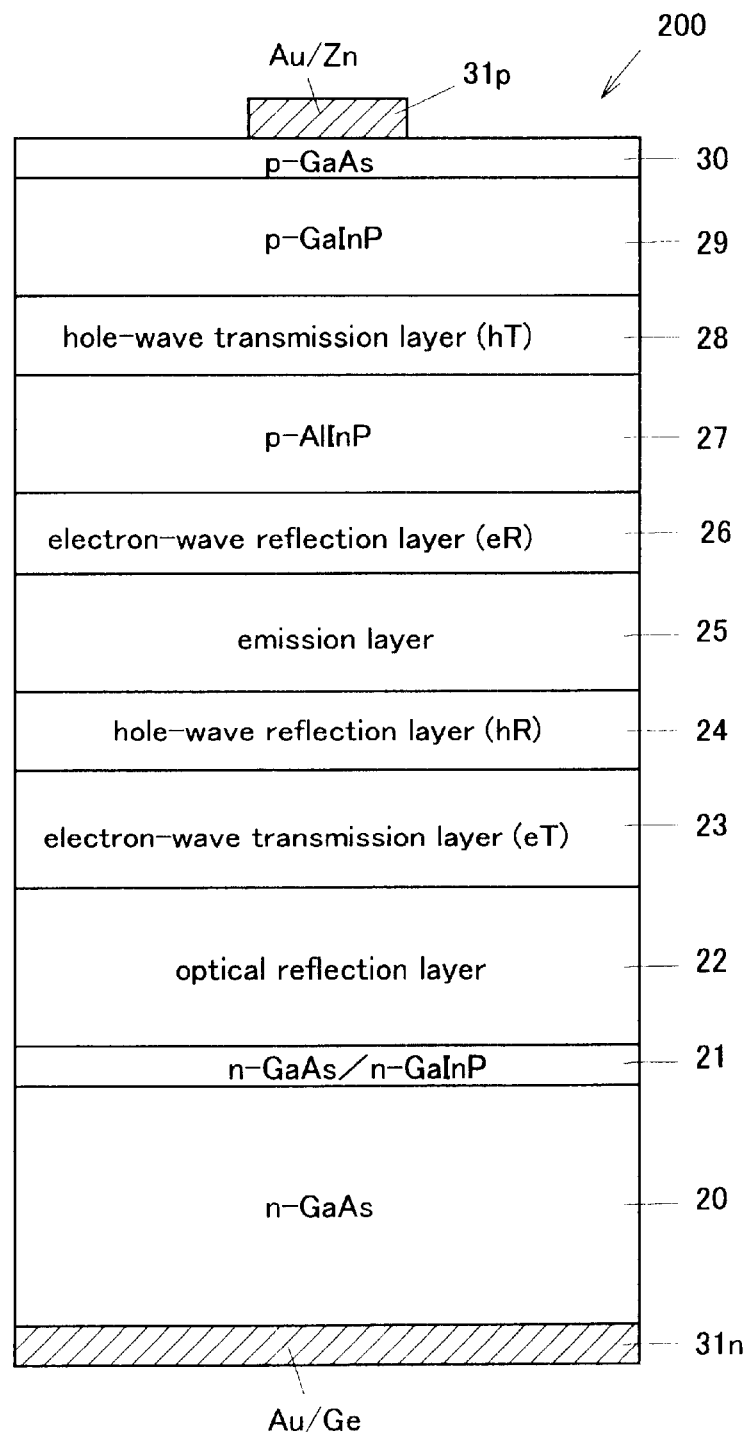
FIG. 10 is a sectional view showing a structure of a light-emitting device 200 according to the second embodiment of the present invention.

FIG. 10 is a sectional view of a light-emitting diode 200 comprising two quantum-wave interference layers on a p-type layer side and two quantum-wave interference layers on an n-type layer side. The light-emitting device 200 has a substrate 20 made of gallium arsenide (GaAs). A buffer layer 21 comprising an n-GaAs layer, having a thickness of 0.3 $\mu$m and an electron concentration of $2\times10^{18}/cm^3$, and an n-$Ga_{0.5}In_{0.5}P$ layer, having a thickness of 0.2 $\mu$m and an electron concentration of $2\times10^{18}/cm^3$, is formed on the substrate 20. An optical reflection layer 22, which has a thickness of about 2.5 $\mu$m and has a multiple layer structure comprising 25 pairs of an n-$Al_{0.5}In_{0.5}P$ layer and an n-$Ga_{0.5}In_{0.5}P$ layer, is formed on the buffer layer 21. The n-$Al_{0.5}In_{0.5}P$ layer has a thickness of 53 nm and an electron concentration of $2\times10^{18}/cm^3$, and the n-$Ga_{0.5}In_{0.5}P$ layer has a thickness of 48 nm and an electron concentration of $2\times10^{18}/cm^3$.

An electron-wave transmission layer (eT) 23, which has a thickness of about 0.5 $\mu$m and has a multiple layer structure comprising 20 pairs of an n-$Al_{0.5}In_{0.5}P$ layer and an n-$Ga_{0.5}In_{0.5}P$ layer, is formed on the optical reflection layer 22. The n-$Ga_{0.5}In_{0.5}P$ layer has a thickness of 10 nm and an electron concentration of $2\times10^{18}/cm^3$, and the n-$Al_{0.5}In_{0.5}P$ layer has a thickness of 14 nm and an electron concentration of $2\times10^{18}/cm^3$. And 40 n-$Al_{0.33}Ga_{0.33}In_{0.33}P$ layers are formed between each interfaces of the n-$Al_{0.5}In_{0.5}P$ layer and the n-$Ga_{0.5}In_{0.5}P$ layer. The n-$Al_{0.33}Ga_{0.33}In_{0.33}P$ layer has a thickness of 1.3 nm.

A hole-wave reflection layer (hR) 24, which has a thickness of about 20 nm and has a multiple layer structure comprising 10 pairs of an n-$Al_{0.5}In_{0.5}P$ layer and an n-$Ga_{0.5}In_{0.5}P$ layer, is formed on the electron-wave transmission layer (eT) 23. The n-$Ga_{0.5}In_{0.5}P$ layer has a thickness of 1 nm and an electron concentration of $1\times10^{18}/cm^3$, and the n-$Al_{0.5}In_{0.5}P$ layer has a thickness of 1.2 nm and an electron concentration of $1\times10^{18}/cm^3$.

An emission 25 having a multiple layer structure is formed on the hole-wave reflection layer (hR) 24. The following layers are laminated in the emission layer 25 on the hole-wave reflection layer (hR) 24 in sequence: a non-doped i-$Al_{0.5}In_{0.5}P$ layer having a thickness of 50 nm; a non-doped i-$Ga_{0.3}In_{0.7}P$ layer having a thickness. of 12 nm; a non-doped i-$Al_{0.5}In_{0.5}P$ layer having a thickness of 3 nm; a non-doped i-$Ga_{0.3}In_{0.7}P$ layer having a thickness of 12 nm; a non-doped i-$Al_{0.5}In_{0.5}P$ layer having a thickness of 3 nm; a non-doped i-$Ga_{0.3}In_{0.7}P$ layer having a thickness of 12 nm; and a non-doped i-$Al_{0.5}In_{0.5}P$ layer having a thickness of 50 nm. The i-$Ga_{0.3}In_{0.7}P$ layer is a well layer and the i-$Al_{0.5}In_{0.5}P$ layer is a barrier layer. Accordingly, the emission layer 25 has a multiple. quantum well (MQW) structure, and has a thickness of about 0.15 $\mu$m.

An electron-wave reflection layer (eR) 26, which has a thickness of about 0.3 $\mu$m and has a multiple layer structure comprising 20 pairs of a p-$Al_{0.5}In_{0.5}P$ layer and a p-$Ga_{0.5}In_{0.5}P$ layer, is formed on the emission layer 25. The p-$Ga_{0.5}In_{0.5}P$ layer has a thickness of 5 nm and a hole concentration of $1\times10^{18}/cm^3$, and the p-$Al_{0.5}In_{0.5}P$ layer has a thickness of 7 nm and a hole concentration of $1\times10^{18}/cm^3$. And 40 $Al_{0.33}Ga_{0.33}In_{0.33}P$ layers are formed between each interfaces of the p-$Al_{0.5}In_{0.5}P$ layer and the p-$Ga_{0.5}In_{0.5}P$ layer. The n-$Al_{0.33}Ga_{0.33}In_{0.33}P$ layer has a thickness of 1.3 nm.

A p-cladding layer 27 of p-$Al_{0.5}In_{0.5}P$, having a hole concentration of $1\times10^{18}/cm^3$ and a thickness of about 0.4 $\mu$m, is formed on the electron-wave reflection (eR) layer 26. A hole-wave transmission layer (hT) 28, which has a thickness of about 40 nm and has a multiple layer structure comprising 10 pairs of a p-$Al_{0.5}In_{0.5}P$ layer and p-$Ga_{0.5}In_{0.5}P$ layer, is formed on the p-cladding layer 27. The p-$Ga_{0.5}In_{0.5}P$ layer has a thickness of 2 nm and a hole concentration of $2\times10/cm^3$, and the p-$Al_{0.5}In_{0.5}P$ layer has a thickness of 2.4 nm and a hole concentration of $2\times10^{18}/cm^3$.

A p-$Ga_{0.5}In_{0.5}P$ layer, having a hole concentration of $2\times10^{18}/cm^3$ and a thickness of about 25 nm, is formed as a second p-contact layer 29 on the hole-wave transmission layer (hT) 28. A p-GaAs layer, having a hole concentration of $2\times10^{18}/cm^3$ and a thickness of about 60 nm, is, formed as a first p-contact layer 30 on the second p-contact layer 29. An electrode layer 31n made of gold and germanium (Au/Ge), having a thickness generally of 0.2 $\mu$m, is formed so as to cover the entire back of the substrate 20. Another electrode layer 31p made of Au/Zn, having a thickness generally of 0.2 $\mu$m, is formed on some portion of the first p-contact layer 30. And the substrate 20 has a diameter of 2.0 inches and the normal direction of its main surface is offset toward the [011] axis by 15 degree from the (100) plane.

The light-emitting diode 200 was manufactured by gas source molecular beam epitaxial deposition (GS-MBE), the same method that the light-emitting diode 100 was manufactured by. Alternatively, the light-emitting diode 200 can be manufactured by metal organic chemical vapor deposition (MOCVD).

With respect to luminous characteristics of the light-emitting diode 200, a luminous wavelength was 682 nm and half-width was 18 nm. A photocoupler formed by coupling the light-emitting diode 200 and a photodiode has a frequency response characteristics of 100 to 200 MHz, which is much more larger than a frequency response characteristics of a commercial product, 20 MHz.

As characteristics of the liqht-emitting diodes 100 and 200 in the first and the second embodiments of the present invention, temperature variation of their luminous characteristics was measured and a temperature dependency of luminous wavelength and half-width in a range from 20° C. to 80° C. was obtained. In the light-emitting diode 100 of the first embodiment, a temperature dependency of luminous wavelength is from 0.06 nm/° C. to 0.09 nm/° C. and a temperature dependency of half-width is less than 0.03 nm/° C. In the light-emitting diode 200 of the second embodiment, a temperature dependency of luminous wavelength is less than 0.02 nm/° C. and a temperature dependency of half-width is from 0.02 nm/° C. to 0.03 nm/° C. The temperature dependencies of luminous wavelength and half-width in the light-emitting diode 100 and 200 are considerably smaller than those in a general commercial product, whose temperature dependencies of luminous wavelength and half-width are 0.2 nm/° C. and 0.15 nm/° C., respectively. Accordingly, the quantum-wave interference layers in the present invention enable temperature dependency to be much smaller compared with those of the light-emitting diode with conventional layers.

In the first embodiment, two quantum-wave interference layers are formed for electrons in the light-emitting diode 100. The quantum-wave interference layers function as the electron-wave transmission layer 13 and the electron-wave reflection layer 16, and the emission layer 15 and the hole-wave reflection layer 14 are formed between the two quantum-wave interference layers. Alternatively, the hole-wave reflection layer 14 is not necessarily needed. For example, a diode can be formed to have the emission layer 15, the electron-wave transmission layer 13 formed on the n-type.(or the negative electrode) side of the emission layer 15, and the electron-wave reflection layer 16 formed on the p-type (or the positive electrode) side of the emission layer 15 and a quantum-wave interference layer for holes is not existed. In short, a light-emitting diode shown in FIG. 8 may function without the hole-wave reflection layer 14. Because electrons have larger mobility in a semiconductor compared with holes, forming a pair of quantum-wave interference layers as an electron-wave transmission layer and an electron-wave reflection layer, respectively, improves effectivity of a light-emitting diode as in the present invention.

Alternatively, forming quantum-wave interference layers for holes as a transmission layer and as a reflection layer and without forming a quantum-wave interference layer for electrons can be applied to the light-emitting diode of the present invention. Such a diode comprises an emission layer, a hole-wave reflection layer formed on the negative electrode side of the emission layer and a hole-wave transmission layer formed on the positive side of the emission layer. Further alternatively, the light-emitting diode can comprise both pairs of quantum-wave interference layers, or a pair of a hole-wave transmission layer and a hole-wave reflection layer, and either one off an electron-wave transmission layer and an electron-wave reflection layer. Order of disposition between the electron-wave transmission layer and the hole-wave reflection layer or between the electron-wave reflection layer and the hole-wave transmission layer is arbitrary.

In the second embodiment, a diode with δ layers are shown. Band gap energy at a potential interface varies sharply and interference effect of quantum-wave is more improved by δ layers. Alternatively, a multiple quantum well (MQW) structure without a δ layer can be applied to a device although its effect will be lowered.

Further, in the second embodiment, a layer having a multiple period structure and the δ layer was made of ternary compounds including $Ga_{0.5}In_{0.5}P/Al_{0.5}In_{0.5}P$ and quaternary compounds including $Al_{0.33}Ga_{0.33}In_{0.33}P$, respectively. Alternatively, the layer having a multiple period structure and a δ layer can be made of binary, ternary and quaternary compounds such as $Al_xGa_yIn_{1-x-y}P$ or $Al_xGa_yIn_{1-x-y}As$ selecting arbitrary composition ratio within the range of $0 \leq x \leq 1$, $0 \leq y \leq 1$, and $0 \leq x+y \leq 1$.

In the present invention, a light-emitting diode was used to show the effectivity of this invention. Alternatively, forming either pair of a reflection layer and a transmission layer for electrons or holes or forming all of them is not necessarily limited to a light-emitting diode, and can be applied to an arbitrary semiconductor device such as a photodiode, a light-receiving device (e.g., a solar battery), a bipolar or a field-effect transistor, and so on.

As another alternative, the layer having a multiple period structure can be made of multi-junction of hereto-material such as group III-V compound semiconductor, group II-VI compound semiconductors, Si and Ge, and hereto-semiconductor. The desirable compositions are as follows. Each combinations is represented by a composition of a layer having a wide band width / a layer having a narrow band width // a substrate. And x and y are arbitrary values wherein $0 \leq x \leq 1$ and $0 \leq y \leq 1$, as long as they are not specified. The combinations of desirable compositions shown below are one of optimum examples for a device, and the present invention can be applied to a semiconductor device comprising semiconductor layers of an arbitrary composition.

<1> $Al_xIn_{1-x}P/Ga_yIn_{1-y}P//GaAs$
<2> $Al_xGa_{1-x}As/GaAs//GaAs$
<3> $Ga_xIn_{1-x}P/InP//InP$
<4> $Ga_xIn_{1-x}P/Ga_xIn_{1-x}As//GaAs$
<5> $AlAs/Al_xGa_{1-x}As//GaAs$ ($0.8 \leq x \leq 0.9$)
<6> $InP/Ga_xIn_{1-x}As_yP_{1-y}//GaAs$
<7> $Si/SiGe_x$//arbitrary material ($0.1 \leq x \leq 0.3$)
<8> $Si/SiGe_xC_y$//arbitrary material ($0.1 \leq x \leq 0.3$, $0 < y \leq 0.1$)
<9> $Al_{x1}Ga_{y1}In_{1-x1-y1}N/Al_{x2}Ga_{y2}In_{1-x2-y2}//Si$, SiC, GaN, or sapphire ($0 \leq x_1, X_2, Y_1, Y_2, x_1+y_1, x_2+y_2 \leq 1$)

In a semiconductor of hetero-material having the above 9 combinations of compositions, doping arbitrary impurities, or adding dopants into the hetero-material to control the conduction type and resistivity, can be applied to the present invention. Alternatively, a part of the composition elements can be replaced with other elements in the same group. For example, a part of group III composition elements such as Al, Ga and In can be replaced with other group III elements, e.g., B and Tl. Also a part of group V composition elements such as P and As can be replaced with other group V elements, e.g., N, Sb, and Bi.

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority document, filed in Japan on Aug. 27, 1999, the entire contents of which is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device comprising:
   a first quantum-wave interference layer having plural periods of a pair of a first layer and a second layers, said second layer having a wider band gap than said first layer;
   a second quantum-wave interference layer having plural periods of a pair of a third layer and a fourth layers, said fourth layer having a wider band gap than said third layer; and
   wherein each thickness of said first and said second layers in said first quantum-wave interference layer is determined by multiplying by an odd number one fourth of quantum-wave wavelength of carriers in each of said first and said second layers, and each thickness of said third and said fourth layers in said second quantum-wave interference layer is determined by multiplying by an even number one fourth of quantum-wave wavelength of carriers in each of said third and fourth layers.

2. A semiconductor device according to claim 1, wherein each thickness of said first and said second layers in said first quantum-wave interference layer is determined by multiplying by an odd number one fourth of quantum-wave wavelength of carriers in each of said first and said second layers existing at a level near the lowest energy level of said second layer, and each thickness of said third and fourth layers in said second quantum-wave interference layer is determined by multiplying by an even number one fourth of quantum-wave wavelength of carriers in each of said third and fourth layers existing at a level near the lowest energy level of said fourth layer.

3. A semi conductor device according to claim 1 comprising:
   a $δ_R$ layer for sharply varying energy band, being formed between said first and said second layers, wherein said $δ_R$ layer is substantially thinner than that of said first and said second layers.

4. A semiconductor device according to claim 1 comprising:
   a $δ_T$ layer for sharply varying energy band, being formed between said third and said fourth layers, wherein said $δ_T$ layer is substantially thinner than that of said third and said fourth layers.

5. A semiconductor device according to claim 1, wherein said wavelength $\lambda_{RW}$ in said first layer is determined by a formula $\lambda_{RW}=h/[2m_{RW}(E_R+V_R)]^{1/2}$, said wavelength $\lambda_{RB}$ in said second layer is determined by a formula $\lambda_{RB}=h/(2m_{RB}E_R)^{1/2}$, said thickness of said first layer $D_{RW}$ is determined by a formula $D_{RW}=n_{RW}\lambda_{RW}/4$, and said thickness of said second layer $D_{RB}$ is determined by a formula $D_{RB}=n_{RB}\lambda_{RB}/4$, where h, $m_{RW}$, $m_{RB}$, $E_R$, $V_R$, and $n_{RW}$ and $n_{RB}$ represent a Plank's constant, effective mass of said carrier in said first layer, effective mass of said carrier in said second layer, kinetic energy of carriers at the level near the lowest energy level in said second layer, potential energy of said second layer to said first layer, and odd numbers, respectively.

6. A semiconductor device according to claim 1, wherein said wavelength $\lambda_{TW}$ in said third layer is determined by a formula $\lambda_{TW}=h/[2m_{TW}(E_T+V_T)]^{1/2}$, said wavelength $\lambda_{TB}$ in said fourth layer is determined by a formula $\lambda_{TB}=h/(2m_{TB}E_T)^{1/2}$, said thickness of said third layer $D_{TW}$ is determined by a formula $D_{TW}=n_{TW}\lambda_{TW}/4$, and said thickness of said fourth layer $D_{TB}$ is determined by a formula $D_{TB} = n_{TB}\lambda_{TB}/4$, where h, $m_{TW}$, $m_{TB}$, $E_T$, $V_T$, and $n_{TW}$ and $n_{TB}$ represent a Plank's constant, effective mass of said carrier in said third layer, effective mass of said carrier in said fourth layer, kinetic energy of carriers at the level near the lowest energy level in said fourth layer, potential energy of said fourth layer to said third layer, and even numbers, respectively.

7. A semiconductor device according to claim 1, wherein said first quantum-wave interference layer comprises:

a plurality of partial quantum-wave interference layers $I_{Rk}$ with $T_{Rk}$ periods of a pair of said first layer and said second layer being displaced in series by varying k as 1, 2, . . . , and wherein index k of said plurality of said partial quantum-wave interference layers corresponds to index k of kinetic energy level $E_{Rk}+V_R$ and $E_{Rk}$ and said first and second layers have thicknesses of $n_{RWk}\lambda_{RWk}/4$, and $n_{RBk}\lambda_{RBk}/4$, respectively, where $E_{Rk}+V_R$ and $E_{Rk}$, $\lambda_{RWk}$ and $\lambda_{RBk}$, and $n_{RWk}$, $n_{RBk}$ represent kinetic energy level of carriers flowing into respective said first layer an d said second layer, wavelength of quantum-wave of carriers flowing into respective said first layer and said second layer, and odd numbers, respectively, and $\lambda_{RWk}$ and $\lambda_{RBk}$ are determined by functions of $E_{Rk}+V_R$ and $E_{Rk}$, respectively.

8. A semiconductor device according to claim 1, wherein said second quantum-wave interference layer comprises:

a plurality of partial quantum-wave interference layers $I_{Tk}$ with $T_{Tk}$ periods of a pair of said third layer and said fourth layer being displaced in series by varying k as 1, 2, . . . , and wherein index k of said plurality of said partial quantum-wave interference layers corresponds to index k of kinetic energy level $E_{Tk}+V_T$ and $E_{Tk}$ and said third and fourth layers have thickness of $n_{TWk}\lambda_{TWk}/4$, and $n_{TBk}\lambda_{TBk}/4$, respectively, where $E_{TK}+V_T$ and $E_{Tk}$, $\lambda_{TWk}$ and $\lambda_{TBk}$, and $n_{TWk}$, $n_{TBk}$ represent kinetic energy level of carriers flowing into respective said third layer and said fourth layer, wavelength of quantum-wave of carriers flowing into respective said third layer and said fourth layer, and even numbers, respectively, and $\lambda_{TWk}$ and $\lambda_{TBk}$ are determined by functions of $E_{Tk}+V_T$ and $E_{Tk}$, respectively.

9. A semiconductor device according to claim 1, wherein said first quantum-wave interference layer comprises:

a plurality of partial quantum-wave interference layers, each of said partial quantum-wave interference layer having serial pairs of said first layer and said second layer with serial pairs of thicknesses of $(n_{RW1}\lambda_{RW1}/4, n_{RB1}\lambda_{RB1}/4), \ldots, (n_{RWk}\lambda_{RWk}/4, n_{RBk}\lambda_{RBk}/4), \ldots, (n_{RWj}\lambda_{RWj}/4, n_{RBj}\lambda_{RBj}/4)$, and wherein index k in said partial quantum-wave interference layer corresponds to index k of kinetic energy level $E_{Rk}+V_R$ and $E_{Rk}$ and $E_{Rk}+V_R$ and $E_{Rk}$, $\lambda_{RWk}$ and $\lambda_{RBk}$, and $n_{RWk}$, $n_{RBk}$ represent kinetic energy level of carriers flowing into respective said first layer and said second layer, wavelength of quantum-wave of carriers flowing into respective said first layer and said second layer, and odd numbers, respectively, and $\lambda_{RWk}$ and $\lambda_{RBk}$ are determined by functions of $E_{Rk}+V_R$ and $E_{Rk}$, respectively.

10. A semiconductor device according to claim 1, wherein said second quantum-wave interference layer comprises:

a plurality of partial quantum-wave interference layers, each of said partial quantum-wave interference layers having serial pairs of said third layer and said fourth layer with serial pairs of thicknesses of $(n_{TW1}\lambda_{TW1}/4, n_{TB1}\lambda_{TB1}/4), \ldots, (n_{TWk}\lambda_{TWk}/4, n_{TBk}\lambda_{TBk}/4), \ldots, (n_{TWj}\lambda_{TWj}/4, n_{TBj}\lambda_{TBj}/4)$, and wherein index k in said partial quantum-wave interference layer corresponds to index k of kinetic energy level $E_{Tk}+V_T$ and $E_{Tk}$ and $E_{Tk}+V_T$ and $E_{Tk}$, $\lambda_{TWk}$ and $\lambda_{TBk}$, and $n_{TWk}$, $n_{TBk}$ represent kinetic energy level of carriers flowing into respective said third layer and said fourth layer, wavelength of quantum-wave of carriers flowing into respective said third layer and said fourth layer, and even numbers, respectively, and $\lambda_{TWk}$ and $\lambda_{TBk}$ are determined by functions of $E_{Tk}+V_T$ and $E_{Tk}$, respectively.

11. A semiconductor device according to claim 1, wherein said first quantum-wave interference layer functions as a reflection layer for reflecting said carriers and said second quantum-wave interference layer functions as a transmission layer for transmitting said carriers.

12. A semiconductor device according to claim 1, wherein an incident plane in said first quantum-wave interference layer is said second layer having enough thickness to prevent conduction of carriers by a tunneling effect.

13. A semiconductor device according to claim 1, further comprising:

an emission layer formed between said first and said second quantum-wave interference layers.

14. A semiconductor device in which semiconductor layers are laminated comprising:

a first electron-wave interference layer having plural periods of a pair of a first layer and a second layer, said second layer having a wider band gap than said first layer;

a second electron-wave interference layer having plural periods of a pair of a third layer and a fourth layer, said fourth layer having a wider band gap than said third layer;

a first hole-wave interference layer having plural periods of a pair of a fifth layer and a sixth layer, said sixth layer having a wider band gap than said fifth layer; and a second hole-wave interference layer having plural periods of a pair of a seventh layer and an eighth layer, said eighth layer having a wider band gap than said seventh layer;

wherein each thickness of said first and said second layers in said first electron-wave interference layer is determined by multiplying by an odd number one fourth of electron-wave wavelength in each of said first and said second layers, each thickness of said third and said fourth layers in said second electron-wave interference layer is determined by multiplying by an even number one fourth of electron-wave wavelength in each of said third and said fourth layers, each thickness of said fifth and said sixth layers in said first hole-wave interference layer is determined by multiplying by an odd number one fourth of hole-wave wavelength in each of said fifth and said sixth layers, and each thickness of said seventh and eighth layers in said second hole-wave interference layer is determined by multiplying by an even number one fourth of hole-wave wavelength in each of said seventh and said eighth layers.

15. A semiconductor device according to claim 14, wherein each thickness of said first and said second layers is determined by multiplying by an odd number one fourth of. electron-wave wavelength of electrons in each of said first and said second layers existing at a level near the lowest energy level of said second layer, each thickness of said third and said fourth layers is determined by multiplying by an even number one fourth of electron-wave wavelength of electrons in each of said third and said fourth layers existing at a level near the lowest energy level of said fourth layer, each thickness of said fifth and sixth layers is determined by multiplying by an odd number one fourth of hole-wave wavelength of holes in each of said fifth and sixth layers existing at a level near the lowest energy level of said sixth layer, and each thickness of said seventh and eighth layers is determined by multiplying by an even number one fourth of hole-wave wavelength of holes in each of said seventh and eighth layers existing at a level near the lowest energy level of said eighth layer.

16. A semiconductor device according to claim 14 comprising:

a $\delta_{eR}$ layer for sharply varying energy band, being formed between said first and said second layers, wherein said $\delta_{eR}$ layer is substantially thinner than that of said first and said second layers.

17. A semiconductor device according to claim 14 comprising:

a $\delta_{eT}$ layer for sharply varying energy band, being formed between said third and said fourth layers, wherein said $\delta_{eT}$ layer is substantially thinner than that of said third and said fourth layers.

18. A semiconductor device according to claim 14 comprising:

a $\delta_{hR}$ layer for sharply varying energy band, being formed between said fifth and said sixth layers, wherein said $\delta_{hR}$ layer is substantially thinner than that of said fifth and said sixth layers.

19. A semiconductor device according to claim 14 comprising:

a $\delta_{hT}$ layer for sharply varying energy band, being formed between said seventh and said eighth layers, wherein said $\delta_{hT}$ layer is substantially thinner than that of said seventh and said eighth layers.

20. A semiconductor device according to claim 14, wherein said wavelength $\lambda_{eRW}$ in said first layer is determined by a formula $\lambda_{eRW}=h/[2m_{eRW}(E_{eR}+V_{eR})]^{1/2}$, said wavelength $\lambda_{eRB}$ in said second layer is determined by a formula $\lambda_{eRB}=h/(2m_{eRB}E_{eR})^{1/2}$, said thickness of said first layer $D_{eRW}$ is determined by a formula $D_{eRW}=n_{eRW}\lambda_{eRW}/4$, and said thickness of said second layer $D_{eRB}$ is determined by a formula $D_{eRB}=n_{eRB}\lambda_{eRB}/4$, where h, $m_{eRW}$, $m_{eRB}$, $E_{eR}$, $V_{eR}$, and $n_{eRW}$ and $n_{eRB}$ represent a Plank's constant, effective mass of electrons in said first layer, effective mass of electrons in said second layer, kinetic energy of electrons at the level near the lowest energy level in a conduction band of said second layer, potential energy of said conduction band of said second layer to that of said first layer, and odd numbers, respectively.

21. A semiconductor device according to claim 14, wherein said wavelength $\lambda_{eTW}$ in said third layer is determined by a formula $\lambda_{eTW}=h/[2m_{eTW}(E_{eT}+V_{eT})]^{1/2}$, said wavelength $\lambda_{eTB}$ in said fourth layer is determined by a formula $\lambda_{eTB}=h/(2m_{eTB}E_{eT})^{1/2}$, said thickness of said third layer $D_{eTW}$ is determined by a formula $D_{eTW}=n_{eTW}\lambda eTW/4$, and said thickness of said fourth layer $D_{eTB}$ is determined by a formula $D_{eTB}=n_{eTB}\lambda_{eTB}/4$, where h, $m_{eTW}$, $m_{eTB}$, $E_{eT}$, $V_{eT}$, and $n_{eTW}$ and $n_{eTB}$ represent a Plank's constant, effective mass of electrons in said third layer, effective mass of electrons in said fourth layer, kinetic energy of electrons at the level near the lowest energy level in a conduction band of said fourth layer, potential energy of said conduction band of said fourth layer to that of said third layer, and even numbers, respectively.

22. A semiconductor device according to claim 14, wherein said wavelength $\lambda_{hRW}$ in said fifth layer is determined by a formula $\lambda_{hRW}=h/[2m_{hRW}(E_{hR}+V_{hR})]^{1/2}$, said wavelength $\lambda_{hRB}$ in said sixth layer is determined by a formula $\lambda_{hRB}=h/(2m_{hRB}E_{hR})^{1/2}$, said thickness of said fifth layer $D_{hRW}$ is determined by a formula $D_{hRW}=n_{hRW}\lambda_{hRW}/4$, and said thickness of said sixth layer $D_{hRB}$ is determined by a formula $D_{hRB}=n_{hRB}\lambda_{hRB}/4$, where h, $m_{hRW}$, $m_{hRB}$, $E_{hR}$, $V_{hR}$, and $n_{hRW}$ and $n_{hRB}$ represent a Plank's constant, effective mass of holes in said fifth layer, effective mass of holes in said sixth layer, kinetic energy of holes at the level near the lowest energy level in a valence band of said sixth layer, potential energy of said valence band of said sixth layer to that of said fifth layer, and odd numbers, respectively.

23. A semiconductor device according to claim 14, wherein said wavelength $\lambda_{hTW}$ in said seventh layer is determined by a formula $\lambda_{hTW}=h/[2m_{hTW}(E_{hT}+V_{hT})]^{1/2}$, said wavelength $\lambda_{hTB}$ in said eighth layer is determined by a formula $\lambda_{hTB}=h/(2m_{hTB}E_{hT})^{1/2}$, said thickness of said seventh layer $D_{hTW}$ is determined by a formula $D_{hTW}=n_{hTW}\lambda_{hTW}/4$, and said thickness of said eighth layer $D_{hTB}$ is determined by a formula $D_{hTB}=n_{hTB}\lambda_{hTB}/4$, where h, $m_{hTw}$, $m_{hTB}$, $E_{hT}$, $V_{hT}$, and $n_{hTW}$ and $n_{hTB}$ represent a Plank's constant, effective mass of holes in said seventh layer, effective mass of holes in said eighth layer, kinetic energy of holes at the level near the lowest energy level in a valence band of said eighth layer, potential energy of said valence band of said eighth layer to that of said seventh layer, and even numbers, respectively.

24. A semiconductor device according to claim 14, wherein said first electron-wave interference layer comprises:

a plurality of partial electron-wave interference layers $I_{eRk}$ with $T_{eRk}$ periods of a pair of said first layer and said second layer being displaced in series by varying k as 1, 2, . . . , and wherein index k of said plurality of said partial electron-wave interference layers corresponds to index k of kinetic energy level $E_{eRk}+V_{eR}$ and $E_{eRk}$ and said first and second layers have thicknesses of $n_{eRWk}\lambda_{eRWk}/4$, and $n_{eRBk}\lambda_{eRBk}/4$, respectively, where $E_{eRk}+V_{eR}$ and $E_{eRk}$, $\lambda_{eRWk}$ and $\lambda_{eRBk}$, and $n_{eRwk}$, $n_{eRBk}$ represent kinetic energy level of electrons flowing into respective said first layer and said second layer, wavelength of electron-wave propagating in respective said first layer and said second layer, and odd numbers, respectively, and $\lambda_{eRwk}$ and $\lambda_{eRBk}$ are determined by functions of $E_{eRk}+V_{eR}$ and $E_{eRk}$, respectively.

25. A semiconductor device according to claim 14, wherein said first hole-wave interference layer comprises:

a plurality of partial hole-wave interference layers $I_{hRk}$ with $T_{hRk}$ periods of a pair of said fifth layer and said sixth layer being displaced in series by varying k as 1, 2, . . . , and wherein index k of said plurality of said partial hole-wave interference layers corresponds to index k of kinetic energy level $E_{hRk}+V_{hR}$ and $E_{hRk}$ and said fifth and sixth layers have thicknesses of $n_{hRWk}\lambda_{hRWk}/4$, and $n_{hRBk}\lambda_{hRBk}/4$, respectively, where $E_{hRk}+V_{hR}$ and $E_{hRk}$, $\lambda_{hRwk}$ and $\lambda_{hRBk}$, and $n_{hRWk}$, $n_{hRBk}$ represent kinetic energy level of holes flowing into respective said fifth layer and said sixth layer, wavelength of hole-wave propagating in respective said fifth layer and said sixth layer, and odd numbers, respectively, and $\lambda_{hRWk}$ and $\lambda_{hRBk}$ are determined by functions of $E_{hRk}+V_{hR}$ and $E_{hRk}$, respectively.

26. A semiconductor device according to claim 14, wherein said second electron-wave interference layer comprises:

a plurality of partial electron-wave interference layers $I_{eTk}$ with $T_{eTk}$ periods of a pair of said third layer and said fourth layer being displaced in series by varying k as 1, 2, . . . , and wherein index k of said plurality of said partial electron-wave interference layers corresponds to index k of kinetic energy level $E_{eTk}+V_{eT}$ and $E_{eTk}$ and said third and fourth layers have thicknesses of $n_{eTWk}\lambda_{eTWk}/4$, and $n_{eTBk}\lambda_{eTBk}/4$, respectively, where $E_{eTk}+V_{eT}$ and $E_{eTk}$, $\lambda_{eTWk}$ and $\lambda_{eTBk}$, and $n_{eTWk}$, $n_{eTBk}$ represent kinetic energy level of electrons flowing into respective said third layer and said fourth layer, wavelength of electron-wave propagating in respective said third layer and said fourth layer, and even numbers, respectively, and $\lambda_{eTwk}$ and $\lambda_{eTBk}$ are determined by functions of $E_{eTk}+V_{eT}$ and $E_{eTk}$, respectively.

27. A semiconductor device according to claim 14, wherein said second hole-wave interference layer comprises:

a plurality of partial hole-wave interference layers $I_{hTk}$ with $T_{hTk}$ periods of a pair of said seventh layer and said eighth layer being displaced in series by varying k as 1, 2, . . . , and wherein index k of said plurality of said partial hole-wave interference layers corresponds to index k of kinetic energy level $E_{hTk}+V_{hT}$ and $E_{hTk}$ and said seventh and eighth layers have thicknesses of $n_{hTWk}\lambda_{hTWk}/4$, and $n_{hTBk}\lambda_{hTBk}/4$, respectively, where $E_{hTk}+V_{hT}$ and $E_{hTk}$, $\lambda_{hTWk}$ and $\lambda_{hTBk}$, and $n_{hRTk}$, $n_{hTBk}$ represent kinetic energy level of holes flowing into respective said seventh layer and said eighth layer, wavelength of hole-wave propagating in respective said seventh layer and said eighth layer, and even numbers, respectively, and $\lambda_{hTWk}$ and $\lambda_{hTBk}$ are determined by functions of $E_{hTk}+V_{hT}$ and $E_{hTk}$, respectively.

28. A semiconductor device according to claim 14, wherein said first electron-wave interference layer comprises:

a plurality of partial electron-wave interference layers, each of said partial electron-wave interference. layers having serial pairs of said first layer and said second layer with serial pairs of thicknesses of $(n_{eRW1}\lambda_{eRW1}/4, n_{eRB1}\lambda_{eRB1}/4), \ldots, (n_{eRWk}\lambda_{eRWk}/4, n_{eRBk}\lambda_{eRBk}/4), \ldots, (n_{eRWj}\lambda_{eRWj}/4, n_{eRBj}\lambda_{eRBj}/4)$ and wherein index k in said partial electron-wave interference layer corresponds to index k of kinetic energy level of $E_{eRk}+V_{eR}$ and $E_{eRk}$ and $E_{eRk}+V_{eR}$ and $E_{eRk}$, $\lambda_{eRWk}$ and $\lambda_{eRBk}$, and $n_{eRWk}$, $n_{eRBk}$ represent kinetic energy level of electrons flowing into respective said first layer and said second layer, wavelength of electron-wave propagating in respective said first layer and said second layer, and odd numbers, respectively, and $\lambda_{eRWk}$ and $\lambda_{eRBk}$ are determined by functions of $E_{eRk}+V_{eR}$ and $E_{eRk}$, respectively.

29. A semiconductor device according to claim 14, wherein said first hole-wave interference layer comprises:

a plurality of partial hole-wave interference layers, each of said partial hole-wave interference layers having serial pairs of said fifth layer and said sixth layer with serial pairs: of thicknesses of $(n_{hRW1}\lambda_{hR1}/4, n_{hRB}\lambda_{hRB1}/4), \ldots, (n_{hRWk}\lambda_{hRWk}/4, n_{hRB}\lambda_{hRBk}/4), (n_{hRWj}\lambda_{hRWj}/4, n_{hRB}\lambda_{hRBj}/4)$ and wherein index k in said partial electron-wave interference layer corresponds to index k of kinetic energy level of $E_{hRk}+V_{hR}$ and $E_{hRk}$ and $E_{hRk}+V_{hR}$ and $E_{hRk}$, $\lambda_{hRWk}$ and $\lambda_{hRBk}$, and $n_{hRWk}$, $n_{hRBk}$ represent kinetic energy level of holes flowing into respective said fifth layer and said sixth layer, wavelength of hole-wave propagating in respective said fifth layer and said sixth layer, and odd numbers, respectively, and $\lambda_{hRWk}$ and $\lambda_{hRBk}$ are determined by functions of $E_{hRk}+V_{hR}$ and $E_{hRk}$, respectively.

30. A semiconductor device according to claim 14, wherein said second electron-wave interference layer comprises:

a plurality of partial electron-wave interference layers, each of said partial electron-wave interference layers having serial pairs of said first layer and said second layer with serial pairs of thicknesses of $(n_{eTW1}\lambda_{eTW1}/4, n_{eTB1}\lambda_{eTB1}/4), \ldots, (n_{eTWk}\lambda_{eTWk}/4, n_{eTBk}\lambda_{eTBk}/4), \ldots, (n_{eTWj}\lambda_{eTWj}/4, n_{eTBj}\lambda_{eRBj}/4)$ and wherein index k in said partial electron-wave interference layer corresponds to index k of kinetic energy level of $E_{eTk}+V_{eT}$ and $E_{eTk}$ and $E_{eTk}+V_{eT}$ and $E_{eTk}$, $\lambda_{eTwk}$ and $\lambda_{eTBk}$, and $n_{eTWk}$, $n_{eTBk}$ represent kinetic energy level of electrons flowing into respective said third layer and said fourth layer, wavelength of electron-wave propagating in respective said third layer and said fourth layer, and even numbers, respectively, and $\lambda_{eTWk}$ and $\lambda_{eTBk}$ are determined by functions of $E_{eTk}+V_{eT}$ and $E_{eTk}$, respectively.

31. A semiconductor device according to claim 14, wherein said second hole-wave interference layer comprises:

a plurality of partial hole-wave interference layers; each of said partial hole-wave interference layers having serial pairs of said seventh layer and said eighth layer with serial pairs of thicknesses of $(n_{hTW1}\lambda_{hT1}/4, n_{hTB1}\lambda_{hTB1}/4), \ldots, (n_{hTWk}\lambda_{hTWk}/4, n_{hTBk}\lambda_{hTBk}/4), \ldots, (n_{hTWj}\lambda_{hTWj}/4, n_{hTBj}\lambda_{hTBj}/4)$ wherein index k in said partial electron-wave interference layer corresponds to index k of kinetic energy level of $E_{hTk}+V_{hT}$ and $E_{hTk}$ and $E_{hTk}+V_{hT}$ and $E_{hTk}$, $\lambda_{hTWk}$ and $\lambda_{hTBk}$, and $n_{hTWk}$, $n_{hTBk}$ represent kinetic energy level of holes flowing into respective said seventh layer and said eighth layer, wavelength of hole-wave propagating in respective said seventh layer and said eighth layer, and even numbers, respectively, and $\lambda_{hTWk}$ and $\lambda_{hTBk}$ are determined by functions of $E_{hTk}+V_{hT}$ and $E_{hTk}$, respectively.

32. A semiconductor device according to claim 14, wherein said first electron-wave interference layer functions as a reflection layer for reflecting electrons and said second electron-wave interference layer functions as a transmission layer for transmitting electrons.

33. A semiconductor device according to claim 14, wherein said first hole-wave interference layer functions as a reflection layer for reflecting holes and said second hole-wave interference layer functions as a transmission layer for transmitting holes.

34. A semiconductor device according to claim 14, wherein an incident plane of electron-wave in said first electron-wave interference layer is said second layer having enough thickness to prevent conduction of electrons by a tunneling effect.

35. A semiconductor device according to claim 14, wherein an incident plane of hole-wave in said first hole-wave interference layer is said sixth layer having enough thickness to prevent conduction of holes by a tunneling effect.

36. A semiconductor device according to claim 14, further comprising:

an emission layer formed between said first and said second electron-wave interference layers.

37. A semiconductor device according to claim 14, further comprising:

an emission layer formed between said first and said second hole-wave interference layers.

* * * * *